(12) United States Patent
Kondoh

(10) Patent No.: US 7,000,664 B2
(45) Date of Patent: Feb. 21, 2006

(54) SHEET SET APPARATUS FOR SEALING PREPARATION, OUTPUT LEAD WIRE SET APPARATUS FOR SEALING PREPARATION, AND SEALING PREPARATION APPARATUS

(75) Inventor: Yuzuru Kondoh, Hyogo (JP)

(73) Assignee: Kaneka Corporation, Osaka (JP)

( * ) Notice: Subject to any disclaimer, the term of this patent is extended or adjusted under 35 U.S.C. 154(b) by 516 days.

(21) Appl. No.: 10/026,208

(22) Filed: Dec. 21, 2001

(65) Prior Publication Data

US 2002/0079060 A1 Jun. 27, 2002

(30) Foreign Application Priority Data

Dec. 25, 2000 (JP) .............................. 2000-392959

(51) Int. Cl.
| H01L 21/00 | (2006.01) |
| H01L 31/048 | (2006.01) |
| H01L 25/00 | (2006.01) |
| B23P 21/00 | (2006.01) |
| B23P 19/00 | (2006.01) |

(52) U.S. Cl. .................. 156/443; 156/517; 29/711; 29/730; 29/738; 136/252; 438/64

(58) Field of Classification Search ............... 156/443, 156/517, 519, 521; 136/251, 244, 252, 259, 136/256; 257/433; 438/64, 66, 80; 29/729, 29/730, 738, 739, 711, 714–716, 564, 564.1, 29/564.2

See application file for complete search history.

(56) References Cited

U.S. PATENT DOCUMENTS

| 4,450,033 | A | * | 5/1984 | Little ...................... 156/380.8 |
| 4,746,618 | A | * | 5/1988 | Nath et al. .................... 438/62 |
| 4,808,242 | A | * | 2/1989 | Murata et al. ............... 136/244 |
| 5,705,021 | A | * | 1/1998 | Wurz et al. .................. 156/360 |
| 5,804,023 | A | * | 9/1998 | Carpenter et al. ........... 156/261 |
| 5,830,779 | A | * | 11/1998 | Bressler et al. ................ 438/65 |
| 6,132,569 | A | * | 10/2000 | Shiozaki ................. 204/192.27 |
| 6,182,730 | B1 | * | 2/2001 | Muir ........................... 156/387 |
| 6,357,649 | B1 | * | 3/2002 | Okatsu et al. ........... 228/179.1 |
| 6,369,315 | B1 | | 4/2002 | Mizukami et al. |
| 6,455,347 | B1 | * | 9/2002 | Hiraishi et al. ............... 438/80 |
| 6,469,242 | B1 | | 10/2002 | Kondo |
| 6,841,728 | B1 | * | 1/2005 | Jones et al. .................. 136/244 |

FOREIGN PATENT DOCUMENTS

| EP | 1041647 A1 | * | 10/2000 |
| JP | 09326497 A | * | 12/1997 |
| JP | 2000-286439 | | 10/2000 |
| JP | 2001-077383 | | 3/2001 |

(Continued)

OTHER PUBLICATIONS

Spire Corporation, Manufacturing Equipment Information, found at http://www.spiresolar.com/Solar/manufacturing-.html.*

(Continued)

*Primary Examiner*—Sue A. Purvis
(74) *Attorney, Agent, or Firm*—Hogan & Hartson, LLP

(57) ABSTRACT

A sheet supply section disposed along a transport way of a substrate feeds a sheet wound in a roll shape. A sheet cutting section cuts a sealing sheet to be set on the substrate from a fed portion of the sheet. A sheet set section including a transfer head of a vacuum suction type with a plurality of suction holes disposed therein reciprocates/moves the transfer head over a sheet receiving position in the sheet cutting section and a sheet covering position in the transport way. The sheet set section lowers the transfer head in the sheet receiving position, raises the transfer head at the sheet covering position. The transfer head attracts the sheet at the sheet-receiving position and does not attract the sheet at the sheet covering position the sheet covers the substrate.

14 Claims, 25 Drawing Sheets

FOREIGN PATENT DOCUMENTS

| | | |
|---|---|---|
| JP | 2001-077385 | 3/2001 |
| JP | 2001-077392 | 3/2001 |

OTHER PUBLICATIONS

Nowlan et al., "Automated Solar Cell Assembly Teamed Process Research," Final Subcontract Report, jan. 6, 1993-Oct. 31, 1995, National Renewable Energy Laboratory, Golden, CO.*

Hagerty, John J., "Equipment Development for Automated Assembly of Solar Modules," Final Report, Jan. 1982, US Department of Energy, Tracor MBA, San Ramon, CA.*

* cited by examiner

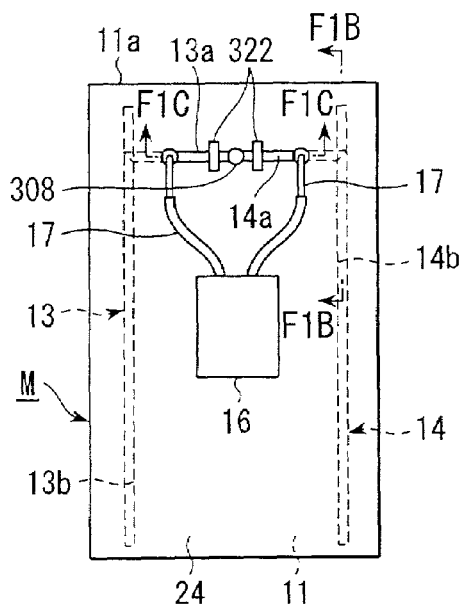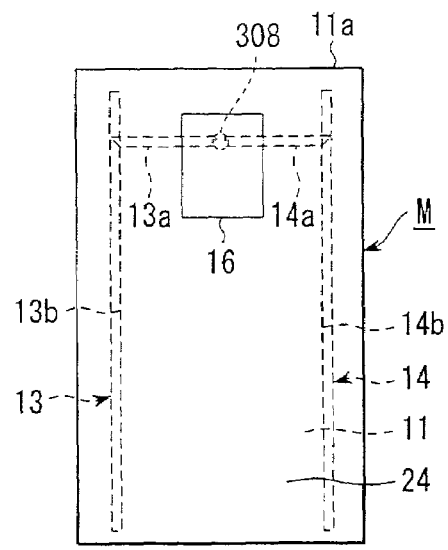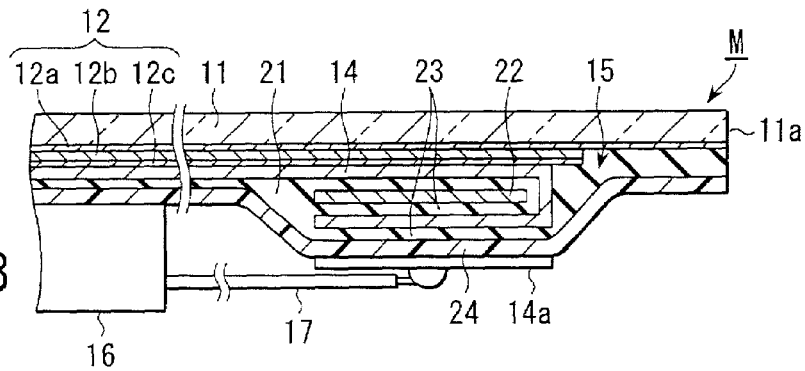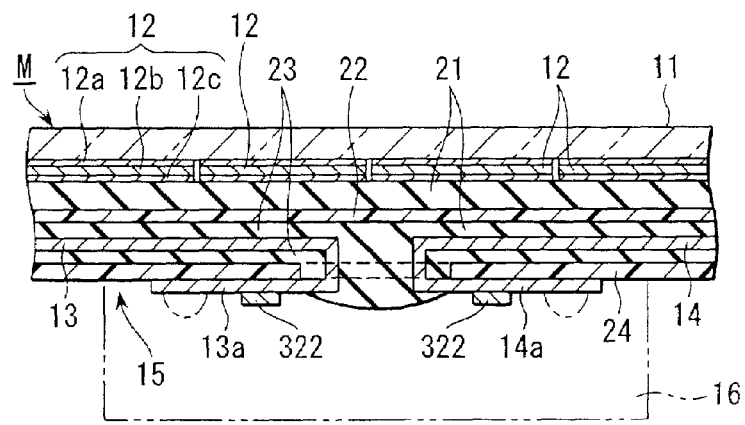
FIG. 1A    FIG. 1D
FIG. 1B
FIG. 1C

Chuck state ←—|—→ Un-chuck state

SHEET SET APPARATUS FOR SEALING PREPARATION, OUTPUT LEAD WIRE SET APPARATUS FOR SEALING PREPARATION, AND SEALING PREPARATION APPARATUS

CROSS-REFERENCE TO RELATED APPLICATIONS

This application is based upon and claims the benefit of priority from the prior Japanese Patent Application No. 2000-392959, filed Dec. 25, 2000, the entire contents of which are incorporated herein by reference.

BACKGROUND OF THE INVENTION

1. Field of the Invention

The present invention relates to a sheet set apparatus for sealing preparation, for example, for use in manufacturing a photovoltaic module and for preparing for sealing of a photovoltaic portion disposed in a substrate of the photovoltaic module, an output lead wire set apparatus for the sealing preparation, and a sealing preparation apparatus.

2. Description of the Related Art

A photovoltaic module includes a substrate of an insulating material such as transparent glass, and a transparent electrode layer separated in a plurality of regions is formed on a back surface of the substrate. A photovoltaic semiconductor layer of amorphous silicon or the like formed on the transparent electrode layer is divided into a plurality of regions forming photovoltaic elements. The respective photovoltaic elements are electrically connected in series by the back-surface electrode layer formed on these elements. A positive lead wire and a negative lead wire for collecting power are disposed on a terminal end of the connection. Output lead wires are individually soldered to both the lead wires.

A photovoltaic module in which one-end portions of the positive lead wire and the negative lead wire are used as the output lead wires is described in Jpn. Pat. Appln. KOKAI Publication No. 2000-286439. This constitution is superior in that the lead wire is not soldered to the output lead wire.

In order to insulate and protect the photovoltaic portion including a plurality of photovoltaic elements, the back surface of the photovoltaic module is sealed.

As preparation for the sealing, various sealing sheets are laminated one by one on the back surface of the substrate in which the photovoltaic portion and lead wire are disposed. These sealing sheets are cut from a sheet wound in a roll shape. In the preparation, the sealing sheet having a wire passing portion is laminated while the output lead wire is passed through the wire passing portion. After all the sealing-sheets are laminated, the output lead wire is bent along the surface of the sealing sheet of an outermost layer, and fixed to the surface of the sealing sheet of the outermost layer with an adhesive tape.

Respective operations such as cutting and laminating of various sealing sheets and passing of the output lead wire through the wire passing portion are manually carried out. Therefore, workability is low, and a sheet dimension and sheet superposing position are easily dispersed. Particularly, in the photovoltaic module in which the one-end portions of the pair of positive and negative lead wires are used as the output lead wires, since the output lead wire needs to be manually bent a plurality of times, productivity is low. Deviations of the sheet dimension and superposing position are sometimes factors for quality degradation of the photovoltaic module. From such circumstances, there is a demand for promotion of automation of a sealing preparation operation in order to enhance productivity and quality of the photovoltaic module.

BRIEF SUMMARY OF THE INVENTION

An object of the present invention is to provide a sheet set apparatus for sealing preparation which can contribute to enhancement of productivity and quality of a photovoltaic module using one-end portions of a positive lead wire and a negative lead wire as output lead wires, an output lead wire set apparatus for sealing preparation, and a sealing preparation apparatus.

According to a first aspect of the present invention, there is provided a sheet set apparatus for sealing preparation, comprising: a sheet supply section; a sheet cutting section; and a sheet set section. The sheet supply section feeds a sheet from a roll. The sheet cutting section cuts a sealing sheet to be set on one surface of a substrate with a photovoltaic portion and a pair of lead wires disposed thereon from a fed portion of the sheet. The sheet set section comprises: a transfer head of a vacuum suction type having a plurality of suction holes formed in a lower surface thereof; a head moving device for reciprocating/moving the head over a sheet receiving position in the sheet cutting section and a sheet covering position in a transport way of the substrate; and a head elevating device for raising/lowering the transfer head in both the positions. The transfer head attracts the sealing sheet from above at the sheet receiving position, and does not attract the sealing sheet at the sheet covering position.

According to the first aspect of the present invention, the sheet is automatically fed from a roll and cut into pieces. Each pieces of sheet is automatically attracted to the head and transported to the substrate and covers the substrate. A wrinkle smoothing operation of the sealing sheet with which the substrate is covered is not required.

According to a second aspect of the present invention, there is provided an output lead wire set apparatus for sealing preparation, comprising: a pair of first bend guide sections; a pair of second bend guide sections; and a wire drawing robot. The first bend guide section includes a first guide plate used as a reference for bending an output lead wire constituted of a one-end portion of a lead wire disposed on one surface of a substrate. The first bend guide section reciprocates/moves the first guide plate over a use position intersecting the lead wire on a transport way of the substrate and a retreat position out of the transport way. The second bend guide section includes a second guide plate which can three-dimensionally move. The second bend guide section reciprocates/moves the second guide plate over a first press position and a second press position. In the first press position a one-side portion of the second guide plate intersects a root portion of the output lead wire bent using the first guide plate as the reference. In the second press position, the other side portion of the second guide plate intersects a middle portion of the output lead wire bent on a side of central portion of a width direction of the substrate using the one side portion of the second guide plate. The wire drawing robot includes a drawing chuck which pinches the output lead wire and can three-dimensionally move. The wire drawing robot draws around the drawing chuck, bends the output lead wire using the first guide plate, bends the output lead wire using the one side portion of the second guide plate, and bends the output lead wire using the other side portion of the second guide plate.

According to the second aspect of the present invention, a plurality of bending operations with respect to the output lead wires integral with a positive lead wire and a negative lead wire can be automated.

According to a third aspect of the present invention, there is provided an output lead wire set apparatus for sealing preparation, comprising: a sheet supply section; a sheet cutting section; a sheet set section; and a wire support section. The sheet supply section feeds a sheet from a roll. The sheet cutting section cuts a sealing sheet which is to be set on one surface of a substrate with a photovoltaic portion and a pair of lead wires disposed thereon and which has a wire passing portion from a fed portion of the sheet. The sheet set section comprises: a transfer head of a vacuum suction type having a plurality of suction holes formed in a lower surface thereof; a head moving device for reciprocating/moving the head over a sheet receiving position in the sheet cutting section and a sheet covering position in a transport way of the substrate; and a head elevating device for raising/lowering the transfer head in both the positions. The transfer head attracts the sealing sheet from above at the sheet receiving position, and does not attract the sealing sheet at the sheet covering position. The wire support section includes a support chuck which can pinch a lower portion of an upward bent portion of the output lead wire. The wire support section reciprocates/moves the support chuck over a pinch position in which an upward portion of the output lead wire is pinched and a retreat position out of the transport way.

According to the third aspect, the sheet is automatically fed from a roll and cut into pieces. Each pieces of sheet is automatically attracted to the head and transported to the substrate and covers the substrate. Additionally, a wrinkle smoothing operation of the sealing sheet with which the substrate is covered is not required. Moreover, in the covering operation of the sealing sheet, the upward portion of the output lead wire can securely be passed through the wire passing portion.

According to a fourth aspect of the present invention, there is provided a sealing preparation apparatus, comprising: a transport way; a first sheet set apparatus; a second sheet set apparatus; an output lead wire set apparatus; a third sheet set apparatus; and a fourth sheet set apparatus. In the transport way, a substrate is transported in a posture in which a surface of the substrate with a photovoltaic portion and a pair of positive and negative lead wires disposed thereon is directed upwards and an output lead wire is disposed on at upstream position with respect to a transport direction. In the first sheet set apparatus, a first sealing sheet is cut from sheet wound in a roll shape, is attracted to a first transfer head, and covers the substrate on the transport way. The second sheet set apparatus cuts a second sealing sheet from an insulating sheet wound in the roll shape, and covers the first sealing sheet with the second sealing sheet on the transport way. The output lead wire set apparatus comprises: a first bend guide section including a first guide plate used as a reference for bending the output lead wire; a second bend guide section; and a drawing robot including a drawing chuck which pinches the output lead wire and three-dimensionally moves. The second bend guide section includes a second guide plate having a one-side portion used as a reference for bending the output lead wire bent using the first guide plate on a side of a central portion of a width direction of the substrate, and the other side portion for bending the output lead wire bent using the one-side portion as the reference upwards. In the third sheet set apparatus, a third sealing sheet having a first wire passing portion is cut from a fed portion of a third sheet wound in the roll shape, is attracted to a third transfer head, and covers the second sealing sheet with the third sealing sheet so that an upward portion is passed through the first wire passing portion on the transport way. In the fourth sheet set apparatus, a fourth sealing sheet having a second wire passing portion and larger than the substrate is cut from the fed portion of a fourth sheet wound in the roll shape, is attracted to a fourth transfer head, and covers the second and third sealing sheets on the transport way. The upward portion that has passed through the first wire passing portion is fed through the second wire passing portion.

According to the fourth aspect, the sheet is automatically fed from a roll and cut into pieces. Each pieces of sheet is automatically attracted to the head and transported to the substrate and covers the substrate. Additionally, a wrinkle smoothing operation of the sealing sheet with which the substrate is covered is not required. Moreover, in the covering operation of the sealing sheet, the upward portion of the output lead wire can securely be passed through the wire passing portion. Furthermore, a plurality of bending operations with respect to the output lead wires integral with a positive lead wire and a negative lead wire can be automated.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1A is a back-surface view showing a photovoltaic module manufactured by a sealing preparation apparatus according to a first embodiment of the present invention as one of manufacturing processes.

FIG. 1B is a sectional view taken along a line F1B—F1B of FIG. 1A.

FIG. 1C is a sectional view taken along a line F1C—F1C of FIG. 1A.

FIG. 1D is a back-surface view showing another photovoltaic module.

DETAILED DESCRIPTION OF THE INVENTION

Figure 2:
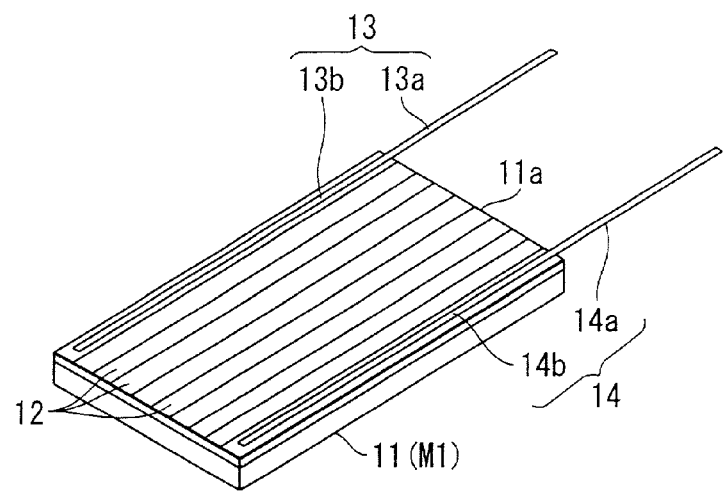
FIG. 2 is a perspective view showing a state before an output lead wire on a substrate disposed in the photovoltaic module of FIG. 1A is bent.

A first embodiment of the present invention will be described hereinafter with reference to FIGS. 1 to 32.

A photovoltaic module M shown in FIGS. 1A to 1D is used, for example, as a building or house roof material, or mounted on a roof for use. The photovoltaic module M includes a substrate 11, a plurality of photovoltaic cells 12 forming a photovoltaic section, a pair of lead wires 13, 14, a sealing layer 15, and a terminal box 16. One lead wire 13 is for a positive electrode, and the other lead wire 14 is for a negative electrode. The sealing layer 15 seals the photovoltaic section and lead wires 13, 14.

In the substrate 11, translucent electric insulating materials, for example a transparent glass substrate and a transparent synthetic resin substrate are used. The substrate 11 is square, and a plurality of photovoltaic cells 12 are disposed on the back surface of the substrate excluding a peripheral portion.

Each photovoltaic cells 12 is formed by successively forming a transparent electrode layer 12a, an amorphous semiconductor layer 12b of amorphous silicon for performing photovoltaic transform, and a back-surface electrode layer 12c on the back surface of the substrate 11. The respective photovoltaic cells 12 are integrated into a plurality of unit cells arranged in rows by patterning using laser, and the like.

The respective photovoltaic cells 12 are connected in series by the back-surface electrode layer 12c. The back-surface electrode layer 12c is formed of a metal foil, conductive paste, or the like. In addition to the amorphous material, a crystalline material can also be used in each photovoltaic cell 12.

The positive lead wire 13 and the negative lead wire 14 form module electrodes from which outputs of the whole photovoltaic module M are taken. These lead wires 13, 14 are formed of lead wire main portions 13b, 14b, and output lead wires 13a, 14a integrally extending from the main portions 13b, 14b. The lead wire main portions 13b, 14b extend along a longitudinal direction of the photovoltaic cells 12, have substantially the same length as that of the cells 12, and are disposed inside an outer periphery of the substrate 11. The output lead wires 13a, 14a forming one-end portions of the lead wires 13, 14 will be described later in detail. In the lead wires 13, 14, an electric wire of a copper foil coated with a solder or tin, and a width of the wire is of the order of 2 mm.

The lead wires 13, 14 are disposed on opposite sides of a group of photovoltaic cells 12, and are electrically connected to the opposite-ends photovoltaic cells 12 via the back-surface electrode layer 12c. The positive and negative lead wires 13, 14 are drawn to the back surface of the sealing layer 15. An insulating coated electric wire 17 connected to a terminal metal (not shown) in the terminal box 16 shown in FIGS. 1A and 1B is soldered to terminal portions of the output lead wires 13a, 14a.

This is not limited. For example, as shown in FIG. 1D, the output lead wires 13a, 14a may directly be guided into the terminal box 16, and connected to the terminal metal (not shown) of the terminal box 16. In this case, the insulating coated electric wire 17 is preferably unnecessary. In FIG. 1A the terminal box 16 is attached to a central portion of the back surface of the photovoltaic module M. The terminal box 16 does not have to be disposed in the central portion of the photovoltaic module M. For example, the terminal box 16 may also be disposed in the vicinity of one side 11a of the photovoltaic module M with respect to an extending direction of the photovoltaic cell 12 as a reference so that a hole 308 described later is closed. Alternatively, the terminal box 16 may also be disposed in the vicinity of the lead wire 13 or 14 so that the hole 308 described later is closed.

In the sealing layer 15 disposed on a back side of the substrate 11, the respective photovoltaic cells 12 and lead wire main portions 13b, 14b are buried, so that these main portions 13b, 14b and respective photovoltaic cells 12 are sealed. The sealing layer 15 is formed using first to fourth sealing sheets 21 to 24.

Ethylene-vinyl acetate copolymer (EVA) is employed in the first and third sealing sheets 21 and 23, but polyvinyl butyral (PVB), silicone resin, and the like may also be used. The second sealing sheet 22 is disposed between the group of photovoltaic cells 12 and the output lead wires 13a, 14a. The second sealing sheet 22 is formed of an electric insulating material, preferably of an electric insulating material having a property such that the molten first sealing sheet 21 can be impregnated, such as nonwoven fabric of glass fiber. In the second sealing sheet 22, the same type of material as the fourth sealing sheet 24 can also be used in order to enhance an insulating property.

The fourth sealing sheet 24 is a protective layer, and forms an outermost layer of the sealing layer 15. The sealing sheet 24 is formed of an insulating film superior in resistance to humidity and water, such as a fluorocarbon resin film, PET film, and Tedler (trade name) film. In the fourth sealing sheet 24, a three-layers sheet formed by sandwiching a metal foil between two insulating films may also be used.

Figure 10:
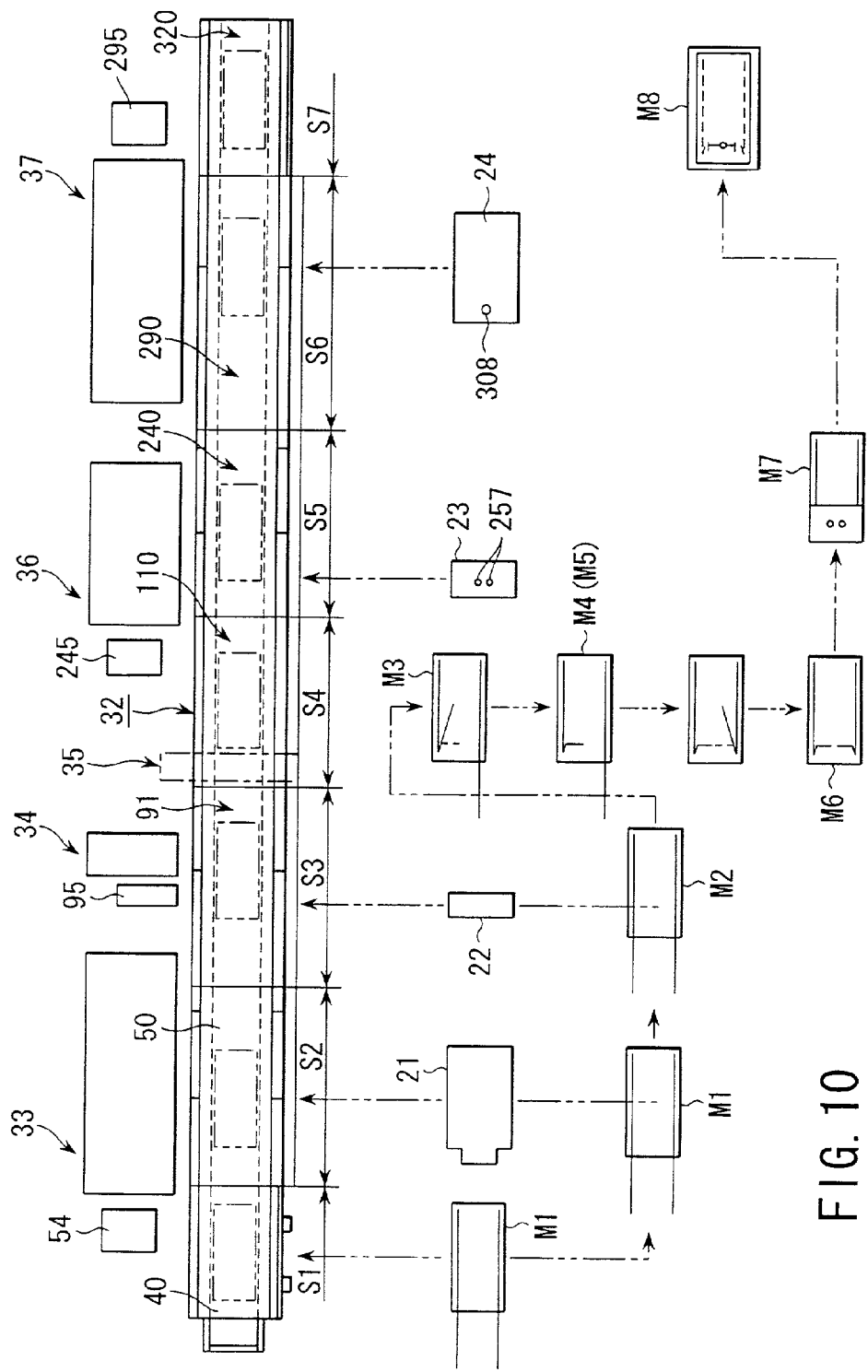
FIG. 10 is a schematic plan view showing a layout of the sealing preparation apparatus according to the first embodiment of the present invention in association with various sealing sheets and a transition of bending of the output lead wire.

A sealing preparation apparatus 31 performs a sealing preparation of the photovoltaic module M. As shown in FIG. 10, the sealing preparation apparatus 31 includes a transport way 32, first sheet set apparatus 33, second sheet set apparatus 34, output lead wire set apparatus 35, third sheet set apparatus 36, and fourth sheet set apparatus 37.

As shown in FIG. 10, the transport way 32 is linear, and is divided into first to seventh work stages S1 to S7 which form a tact system. In the work stages S1 to S7, respective allotted shares of work are completed in the same time, and subsequently a transport operation to the next stage is synchronously performed. When the work of the respective work stages S1 to S7 is successively carried out, the sealing preparation is completed. Since the transport way 32 is linear, the respective allotted shares of work can individually be performed in the respective work stages S1 to S7, and a standby time is advantageously short.

Figure 11:
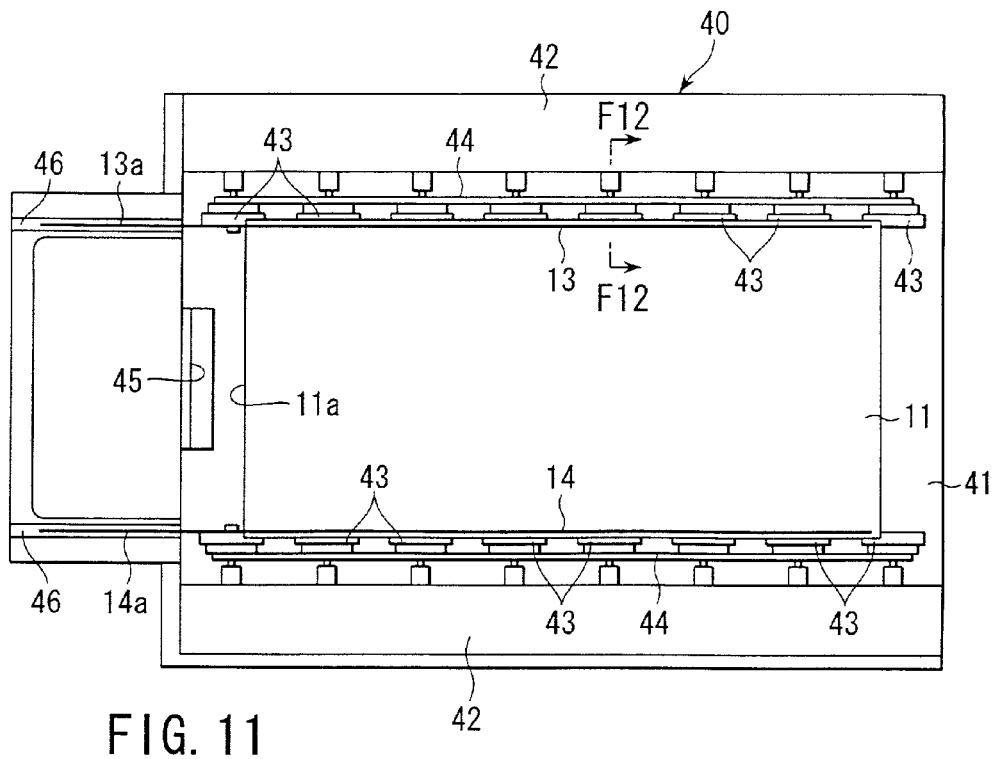
FIG. 11 is a plan view showing a supply section of a transport way disposed in the sealing preparation apparatus of FIG. 10.

The first work stage S1 is formed by a first conveyor 40 constituting a supply section of the transport way 32. As shown in FIG. 11, the first conveyor 40 includes a base 41, a pair of conveyor frames 42, a large number of transport rollers 43, a pair of chains 44, and a driving motor (not shown). The conveyor frames 42 are disposed opposite to each other on the base 41. The transport rollers 43 are attached to the frames 42, respectively. The chains 44 are disposed to connect the transport rollers 43 arranged in a transport direction to one another. The driving motor is built in the base 41, and synchronously drives a pair of chains 44.

Figure 12:
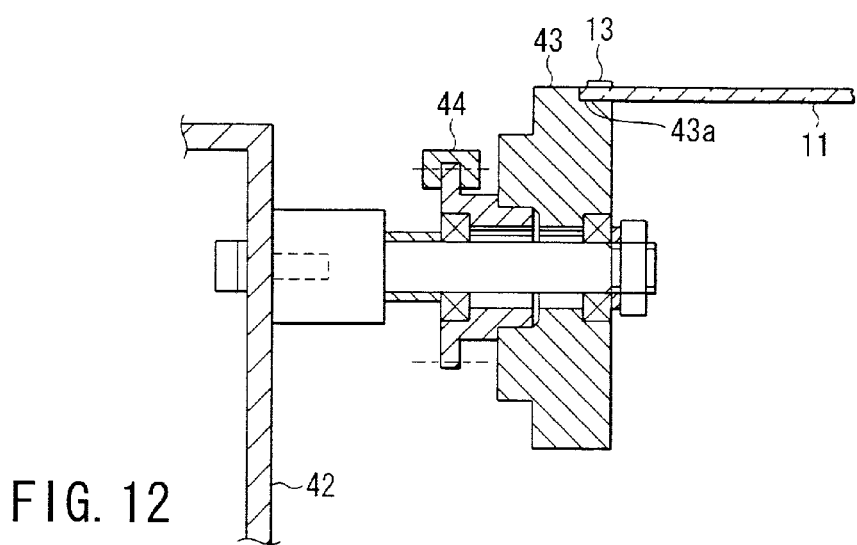
FIG. 12 is a sectional view taken along line F12—F12 of FIG. 11.

As shown in FIG. 12, each transport roller 43 has a step portion 43a on which a side edge of the substrate 11 is laid, and the step portion 43a has a diameter smaller than an outermost diameter of the transport roller 43. The output lead wires 13a, 14a extending from one side 11a of the substrate 11 are laid on the step portion 43a. In FIG. 11, reference numeral 45 denotes a stopper which abuts on the side 11a of the substrate 11 and positions the substrate 11 in the first work stage S1, and 46 denotes a pair of lead wire receiving portions extending from the base 41. The wire receiving portions 46 have a width larger than that of the output lead wires 13a, 14a, and linearly extend.

The substrate 11 with the photovoltaic cells 12 and the pair of lead wires 13, 14 disposed thereon as shown in FIG. 2 (shown by M1 in FIG. 10) is supplied to the first conveyor 40 by appropriate means. In this case, the substrate 11 is supplied in a posture in which the surface with the photovoltaic cells 12 and the pair of lead wires 13, 14 disposed thereon faces upwards, and the output lead wires 13a, 14a extending from the side 11a are positioned to an upstream position with respect to the transport direction of the transport way 32.

The substrate M1 supplied to the first conveyor 40 is positioned while one side 11a abuts on the stopper 45. In this positioned state the output lead wires 13a, 14a extending from the side 11a are manually and individually laid on the lead wire receiving portions 46, and set in the first conveyor 40. When the driving motor is operated in the set state, the substrate M1 is transported to the second work stage S2. The step portion 43a and wire receiving portion 46 prevent the output lead wires 13a, 14a from being inadvertently caught, and are useful in protecting these wires 13a, 14a.

Figure 16:
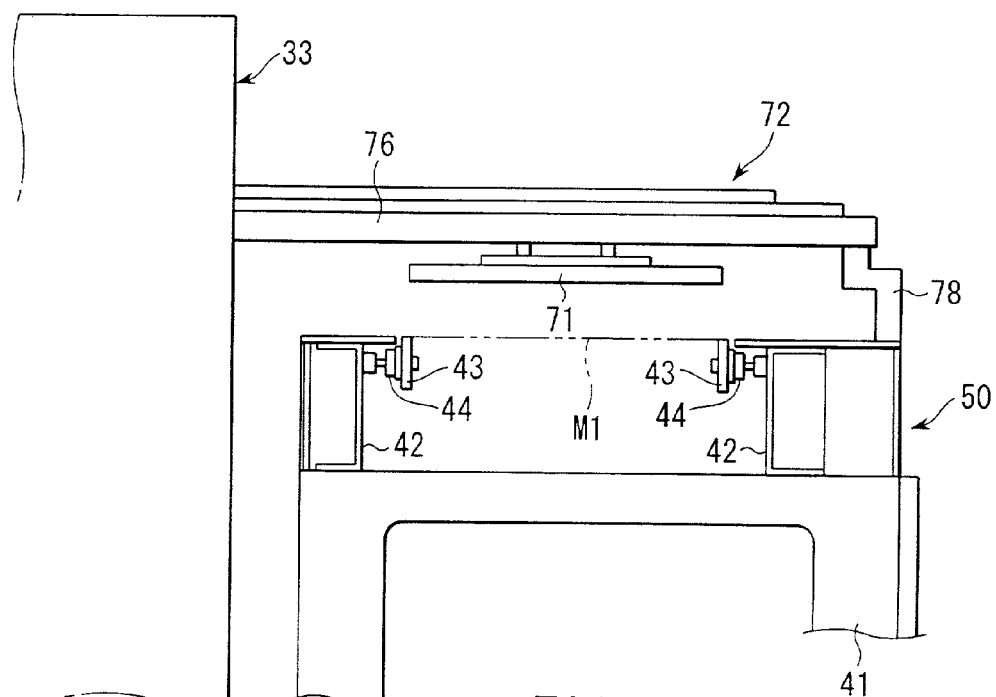
FIG. 16 is a front view showing a second sheet set apparatus disposed in the sealing preparation apparatus of FIG. 10.

The second work stage S2 of the transport way 32 is formed by a second conveyor 50 shown in FIG. 16. Since a constitution of the conveyor 50 is similar to that of the first conveyor 40 excluding the following respects, the same constitution as that of the first conveyor 40 is denoted with the same reference numerals, and description thereof is omitted.

In the second conveyor 50, the lead wire receiving portions 46 are not disposed, but a positioning mechanism (not shown) for automatically positioning the substrate M1 in a predetermined position is disposed. The positioning mechanism includes a first stopper, a pusher, and a driving device of the stopper and pusher. The first stopper is projected from below into the transport way of the substrate M1 transported by the second conveyor 50. The pusher pushes the substrate M1 positioned by the first stopper from one side of the width direction.

Figure 13:
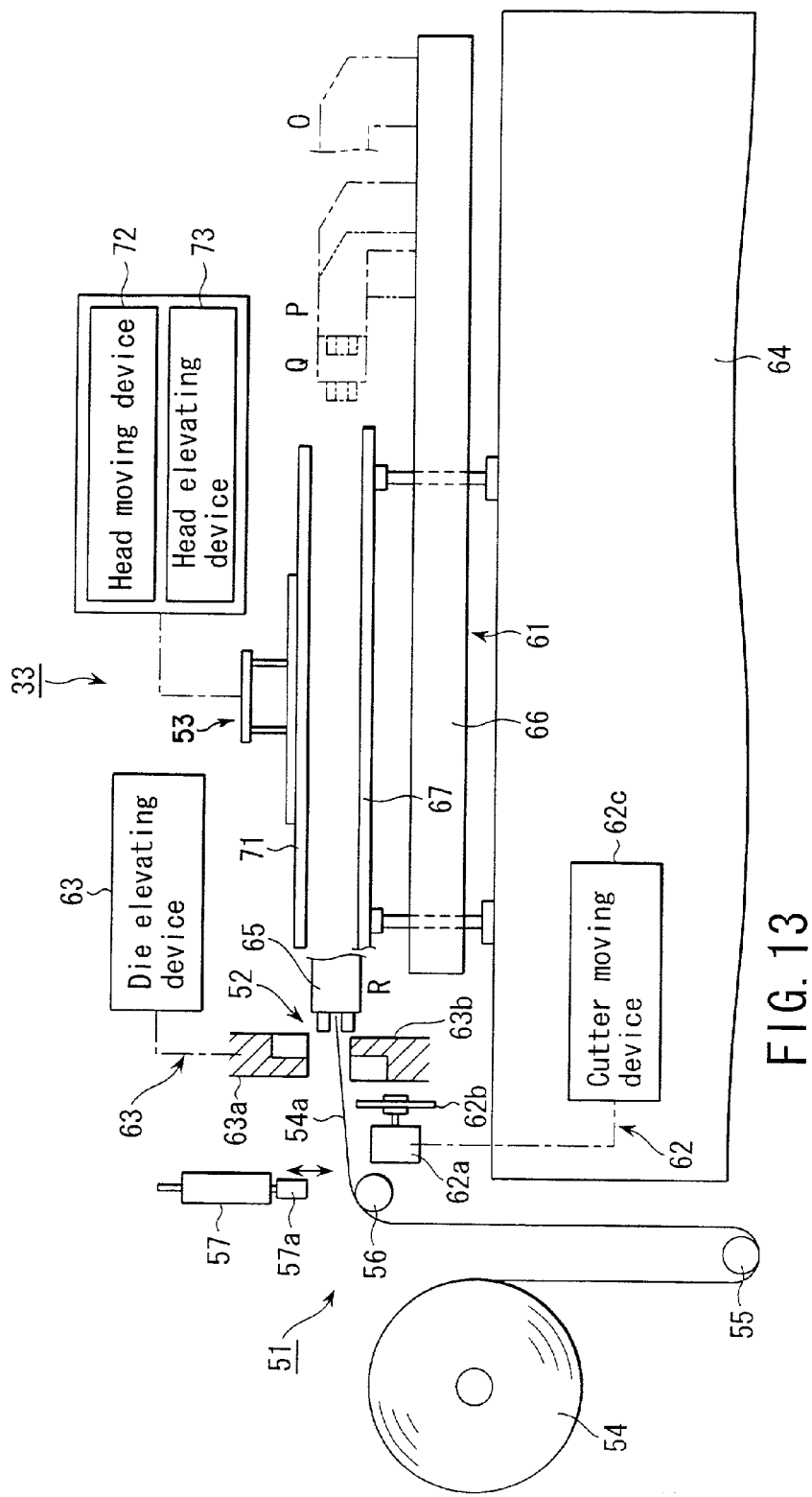
FIG. 13 is a side view schematically showing a first sheet set apparatus disposed in the sealing preparation apparatus of FIG. 10.

As shown in FIG. 10, the first sheet set apparatus 33 is disposed for the second work stage S2 on one side in the width direction, and at a downstream position with respect to the transport direction of the first conveyor 40. As shown in FIGS. 13 and 14, the first sheet set apparatus 33 includes a sheet supply section 51, a sheet cutting section 52, and a sheet set section 53.

The first sheet set apparatus 33 cuts the first sealing sheet 21 a size larger than the substrate 11 and having a predetermined shape from a first sheet 54. The first sheet set apparatus 33 covers the substrate M1 positioned in the second work stage S2 with the first sealing sheet 21 from above. The first sheet 54, for example, of EVA is relatively thick, and has flexibility.

As shown in FIG. 13, the sheet supply section 51 includes a dancer roller 55, guide roller 56, press cylinder 57 of an air type, and the like. The dancer roller 55 guides a fed portion 54a of the first sheet 54 wound in a roll shape, while applying a tension on the fed portion 54a. The guide roller 56 is disposed above the dancer roller 55. A width of the first sheet 54 is the same as that of the first sealing sheet 21. The fed portion 54a of the sheet 54 is guided into the sheet cutting section 52 via the dancer roller 55 and guide roller 56. When the fed portion 54a is pulled in a feeding direction, the first sheet 54 freely rotates with a rotation shaft (not shown) passed through the central portion of the sheet and the feeding is continued. The press cylinder 57 is disposed right above the guide roller 56. The cylinder 57 lowers a press head 57a, and sandwiches the fed portion 54a with the guide roller 56.

As shown in FIG. 13, the sheet cutting section 51 includes a sheet drawing mechanism 61, a first cutting mechanism 62, and a pair of second cutting mechanisms 63. The sheet drawing mechanism 61 includes a chuck moving device 66, and sheet chuck 65. The chuck moving device 66 is fixed onto an apparatus base 64 disposed along the second conveyor 50. The sheet chuck 65 moved by the chuck moving device 66 has an openable/closable tip end for pinching a tip end of the fed portion 54a.

The chuck moving device 66 reciprocates/moves the sheet chuck 65 over a pinching position R (see a position of the sheet chuck 65 shown by a solid line in FIG. 13) and a first drawing position Q (see a position of the sheet chuck 65 shown by a two-dot chain line in FIG. 13). The chuck moving device 66 grasps the fed portion 54a in the pinching position R. In the first drawing position Q, the fed portion 54a is cut/treated by the first cutting mechanism 62 and the first sealing sheet 21 is obtained.

The chuck moving device 66 reciprocates/moves the sheet chuck 65 to a second drawing position P (see the position of the sheet chuck 65 shown by the two-dot chain line in FIG. 13) from the first drawing position Q. In the second drawing position P, the first sealing sheet 21 is cut/treated by the second cutting mechanism 63. The chuck moving device 66 reciprocates/moves the sheet chuck 65 to a third drawing position O (see the position of the sheet chuck 65 shown by the two-dot chain line in FIG. 13) from the second drawing position P. In the third drawing position O, the first sealing sheet 21 is transferred onto a support table 67 disposed on the apparatus base 64. The sheet chuck 65 can move to the grasping position R from the third drawing position O.

As shown in FIG. 13, the first cutting mechanism 62 and the pair of second cutting mechanisms 63 are mounted on the apparatus base 64, and disposed between the guide roller 56 and the grasping position R. The first cutting mechanism 62 includes a rotation blade 62b driven by a motor 62a, and a cutter moving device 62c. The cutter moving device 62c reciprocates/moves the motor 62a and rotation blade 62b along the width direction of the fed portion 54a. With the movement, the fed portion 54a drawn to the first drawing position is cut, and the first sealing sheet 21 is formed.

The pair of second cutting mechanisms 63 comprises a pair of upper and lower blanking dies 63a, 63b, and a die elevating device 63c. The blanking dies 63a, 63b are disposed at the downstream position with respect to the transport direction of the substrate 11 with respect to the first cutting mechanism 62. The die elevating device 63c raises/lowers the upper blanking die 63a with respect to the lower blanking die 63b. These cutting mechanisms 63 cut opposite corners of the first sealing sheet 21 in the vicinity of the upstream side of the transport direction, and form a pair of cutouts 21a (see FIG. 3) in the first sealing sheet 21. The cutting is performed while the first sealing sheet 21 is drawn to the second drawing position.

The sheet cutting section 52 first draws the fed portion 54a of the first sheet 54 to the first drawing position Q, and the first cutting mechanism 62 is operated in this state. The obtained first sealing sheet 21 is drawn/moved to the second drawing position P, the pair of second cutting mechanisms 63 are operated in this position, and the cutouts 21a are formed in the first sealing sheet 21. The operation is repeated by the sheet cutting section 52, and the first sealing sheet 21 having a predetermined shape to be set on the substrate M1 is successively obtained.

Figure 14A:
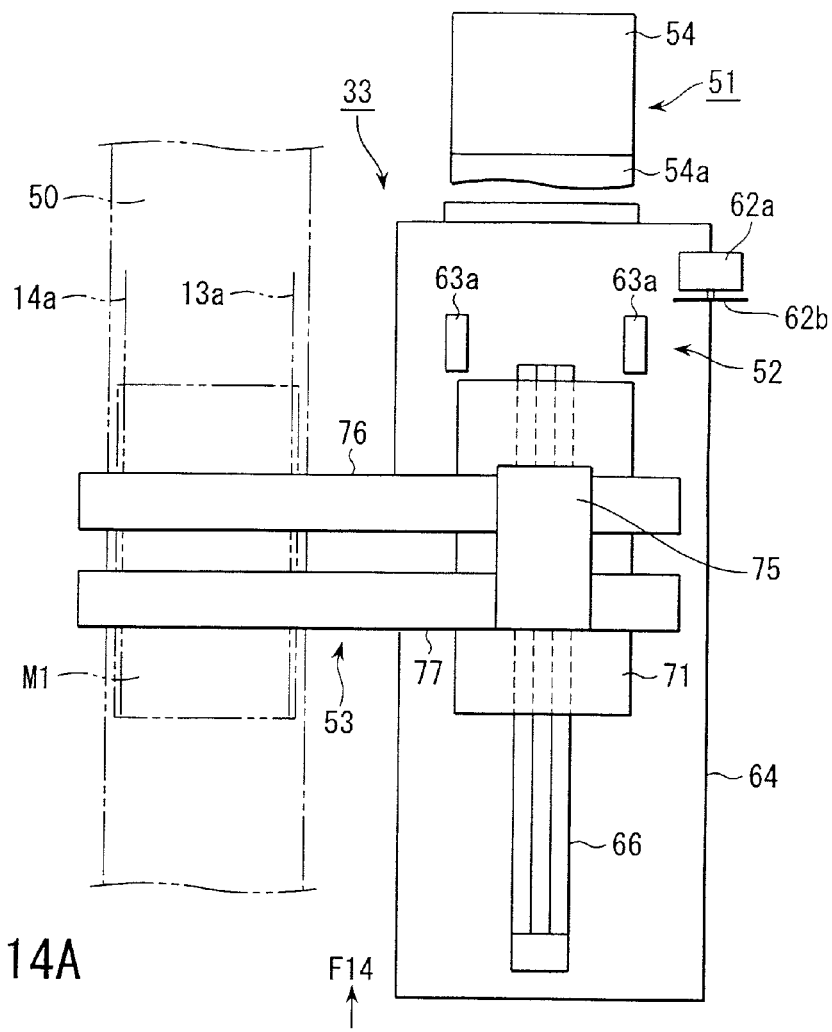
FIG. 14A is a plan view schematically showing the first sheet set apparatus.
Figure 14B:
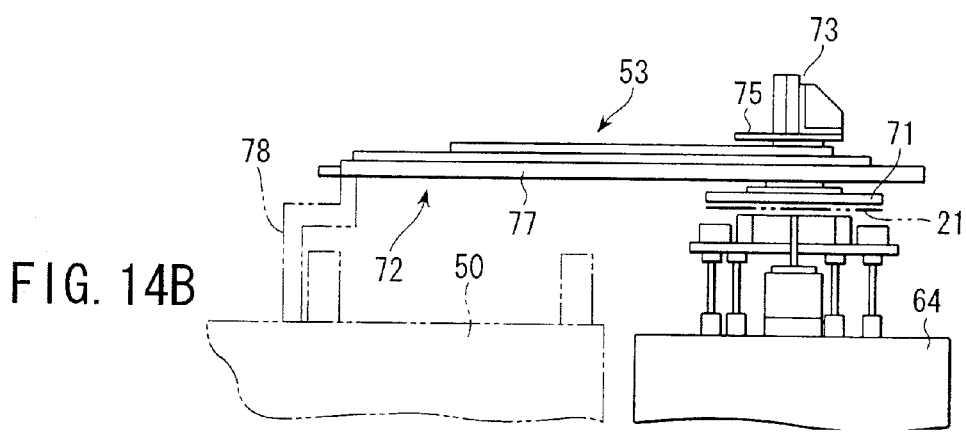
FIG. 14B is a view of the first sheet set apparatus seen from a direction of an arrow F14 of FIG. 14A.

As shown in FIGS. 14A and 14B, the sheet set section 53 includes a first vacuum suction type transfer head 71, a head moving device 72, and a head elevating device 73. As shown in FIG. 15D, the transfer head 71 includes a wall 71a which has the same size or a larger size as compared with a size of the first sealing sheet 21. The wall 71a forms a lower surface of the transfer head 71, and has a flat surface. In the wall 71a, a large number of suction holes 71b are disposed in the whole area, that is, in substantially the same range as that of the first sealing sheet 21. The transfer head 71 is connected to a vacuum suction source (not shown) via a flexible tube which does not inhibit the head 71 from moving.

As shown in FIGS. 14A and 14B, and 15A to 15C, the head moving device 72 includes a moving base 75, driving bar 76, guide bar 77 disposed in parallel to the bar 76, and the like. Opposite ends of the driving bar 76 and guide bar 77 are supported by a frame (not shown) vertically disposed on the apparatus base 64 and a support 78 (see FIG. 16) vertically disposed on the second conveyor 50. A rodless cylinder (not shown) is incorporated as a driving element in the driving bar 76. One end of the moving base 75 is connected to the rodless cylinder, and the other end of the base 75 is slidably connected to the guide bar 77. The moving base 75 is reciprocated/moved along a longitudinal direction of the driving bar 76 and guide bar 77 by driving the rodless cylinder.

Figure 15A:
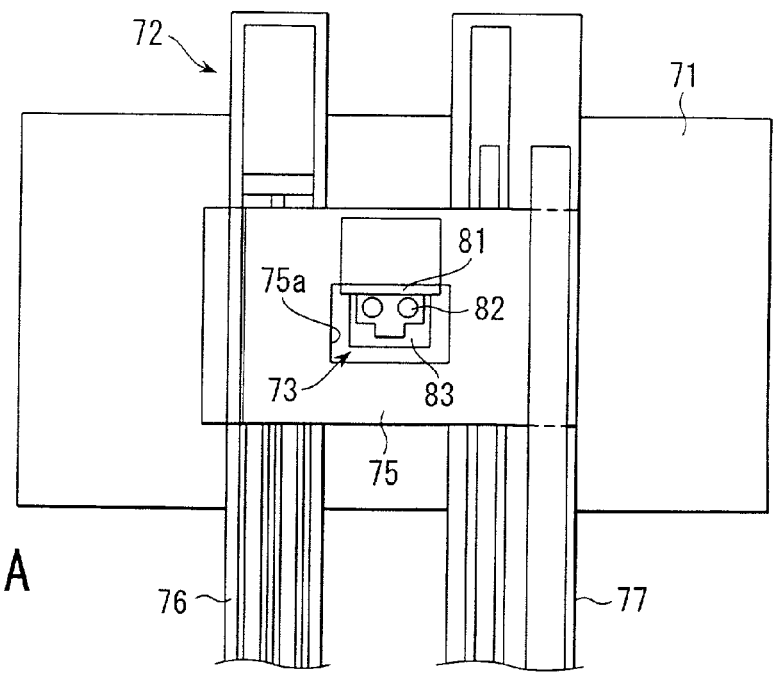
FIG. 15A is a plan view showing a portion around a transfer head of the first sheet set apparatus of FIG. 13.
Figure 15B:
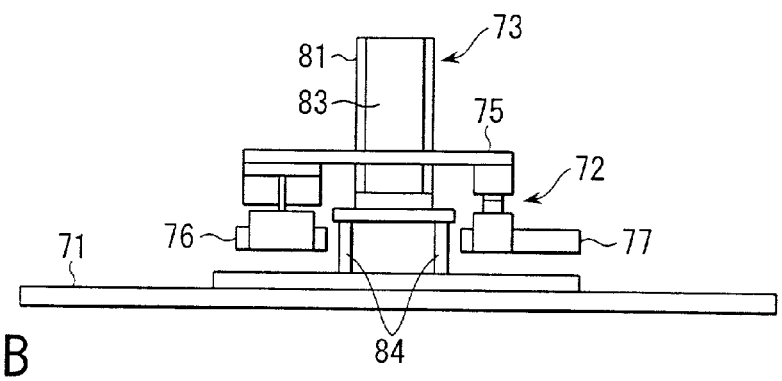
FIG. 15B is a front view showing the portion around the transfer head of the first sheet set apparatus of FIG. 13.
Figure 15C:
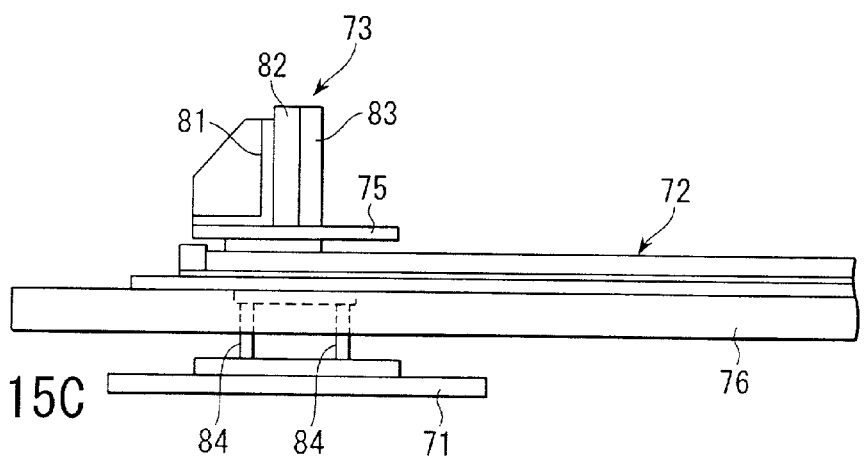
FIG. 15C is a side view showing the portion around the transfer head of the first sheet set apparatus of FIG. 13.
Figure 15D:
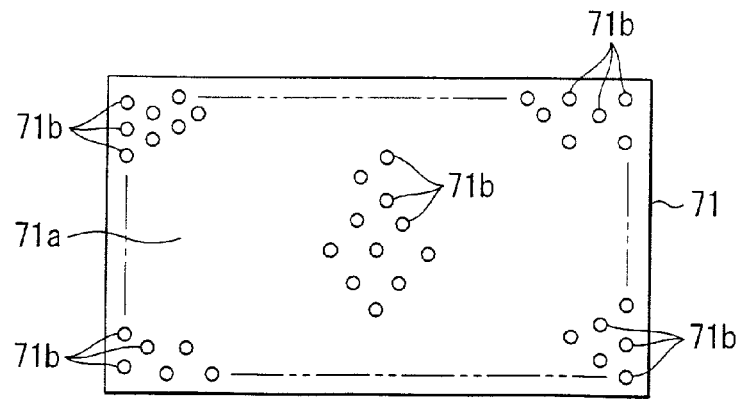
FIG. 15D is a showing the lower surface of the transfer head of the first sheet set apparatus.

As shown in FIGS. 15A to 15C, the head elevating device 73 includes an elevation driving cylinder 82, head support member 83, and the like. The cylinder 82 is vertically attached onto the moving base 75 via a bracket 81. The head support member 83 is raised/lowered by the cylinder 82. The head support 83 is passed through a hole 75a formed in a central portion of the moving base 75, and the transfer head 71 hangs from a lower end of the support member via a plurality of supports 84.

The transfer head 71 connected to the head elevating device 73 is reciprocated/moved over a sheet receiving position and sheet covering position by the head moving device 72, and raised/lowered in both the positions by the head elevating device 73. In the sheet receiving position, the transfer head 71 is disposed right above the support table 67. In the sheet covering position, the transfer head 71 is disposed right above the substrate M1 positioned in the second conveyor 50.

The transfer head 71 raised in the sheet receiving position is disposed above the transport way of the sheet chuck 65. The transfer head 71 lowered in the sheet receiving position holds the whole cut first sealing sheet 21 with the support table 67. When the transfer head 71 is vacuum-sucked in the held state, the first sealing sheet 21 can be attracted to the flat wall 71a of the transfer head 71.

The transfer head 71 raised in the sheet covering position is correctly positioned right above and opposite to the substrate M1. The transfer head 71 lowered in the sheet covering position holds the whole first sealing sheet 21 with the substrate M1. After the transfer head 71 stops attracting the sheet, while the sheet 21 remains held between the head 71 and the substrate M1, it is raised, whereby, the first sealing sheet 21 is reliably be transferred onto the substrate M1 cover the substrate M1.

Figure 3:
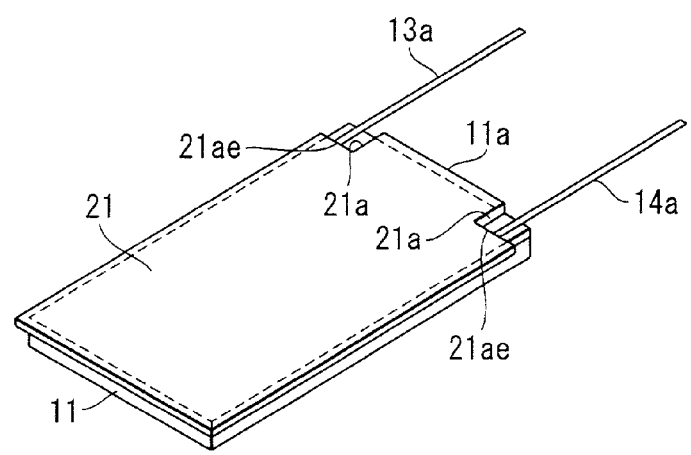
FIG. 3 is a perspective view showing that a first sealing sheet is set on the substrate of FIG. 2.
Figure 4:
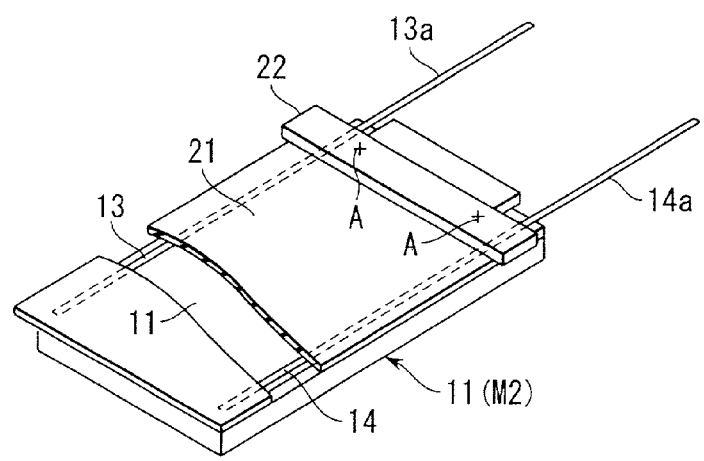
FIG. 4 is a perspective view showing that a second sealing sheet is set on the first sealing sheet of FIG. 3.

FIG. 3 shows that the substrate M1 is covered with the first sealing sheet 21 by the first sheet set apparatus 33. Root portions of the output lead wires 13a, 14a are positioned in the pair of cutouts 21a of the covered first sealing sheet 21. The substrate M1 with the first sealing sheet 21 laminated thereon is transported to a third conveyor 91 with the transporting operation of the second conveyor 50 and third conveyor 91. The third conveyor 91 is disposed to be continuously adjacent to the second conveyor 50 in the transport direction.

The third work stage S3 of the transport way 32 is formed by the third conveyor 91. Since a constitution of the conveyor 91 is similar to that of the first conveyor 40 excluding the following respects, the same constitution as that of the first conveyor 40 is denoted with the same reference numerals, and description thereof is omitted. In the third conveyor 91, the lead wire receiving portions 46 are not disposed, but first and second positioning mechanisms (not shown) for automatically positioning the substrate M1 in the predetermined position is disposed. The first positioning mechanism includes a first stopper, pusher, and the driving device of the stopper and pusher. The first stopper is projected from below into the transport way of the substrate M1 transported by the third conveyor 91. The pusher pushes the substrate M1 positioned by the first stopper from one side of the width direction. The second positioning mechanism is disposed deviating toward the downstream side of the transport direction from the first positioning mechanism. The second positioning mechanism includes a second stopper projected from below into the transport way of the substrate M1 transported by the third conveyor 91, and driving portion. The second stopper positions the substrate M1 covered with the second sealing sheet 22 in a tentative position.

Figures 17A, 17B:
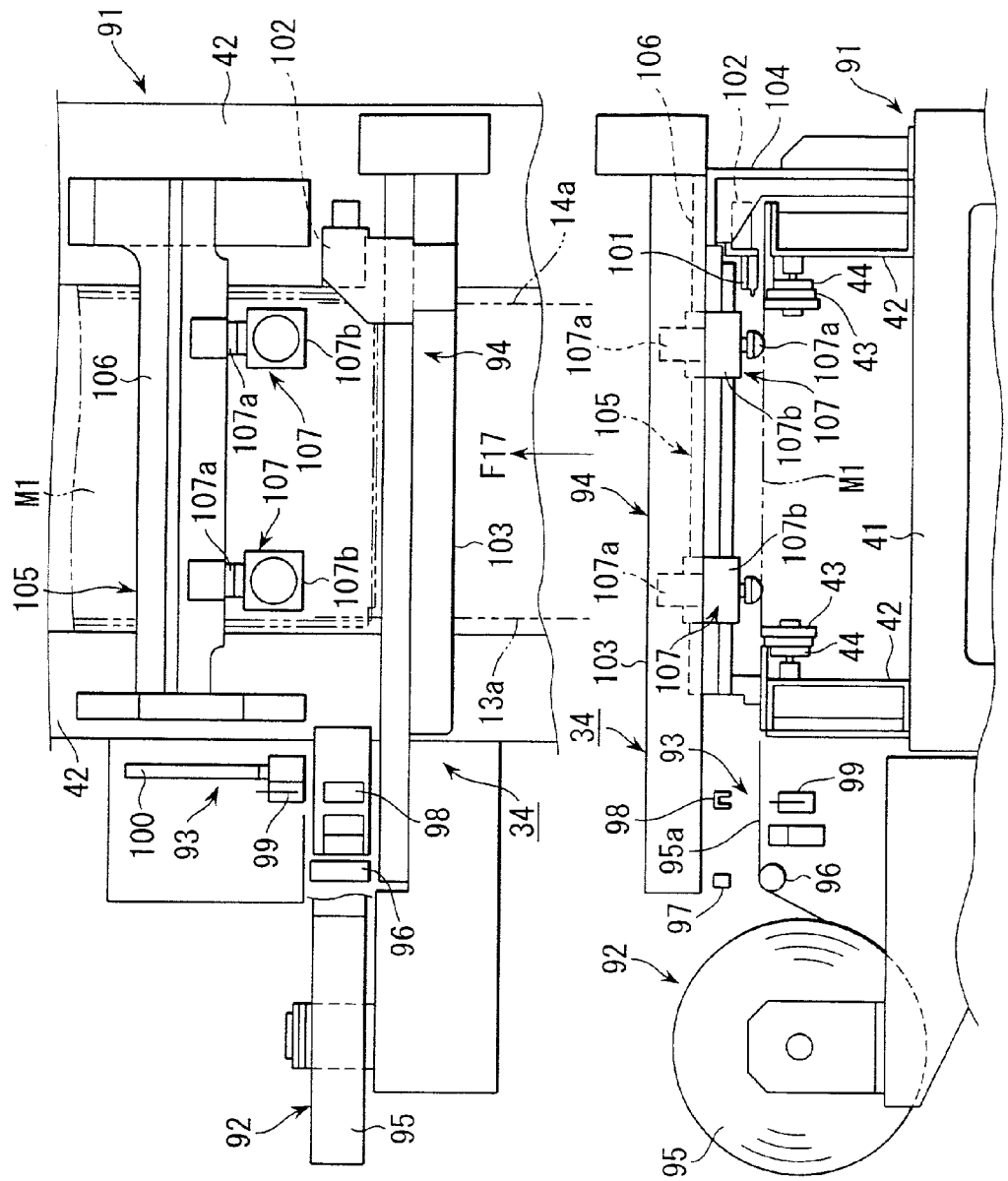
FIG. 17A is a plan view showing a second sheet set apparatus of FIG. 16.
FIG. 17B is a view showing the second sheet set apparatus seen from a direction of an arrow F17 of FIG. 17A.

As shown in FIG. 10, the second sheet set apparatus 34 is disposed on one side of the width direction of the transport way 32 with respect to the third work stage S3, and disposed downstream of the first sheet set apparatus 33 with respect to the transport direction of the substrate M1. As shown in FIGS. 17A and 17B, the second sheet set apparatus 34 includes a sheet supply section 92, sheet cutting section 93, and sheet set section 94. The set apparatus 34 cuts the second sealing sheet 22 which has a predetermined shape, that is, which is slightly longer as compared with a width dimension of the substrate 11 and has a rectangular shape from a second sheet 95, and covers the first sealing sheet 21 on the substrate M1 with the sheet 22 from above. In this case, the substrate M1 is positioned in the third work stage S3.

The sheet supply section 92 includes a guide roller 96 for guiding a fed portion 95a of the second sheet 95 wound in a roll shape. The second sheet 95 has a width necessary for securing electric insulation between the output lead wires 13a, 14a bent as described later and the photovoltaic cells 12. The fed portion 95a is guided into the sheet cutting section 93 via the guide roller 96. When the fed portion 95a is fed and pulled, the second sheet 95 freely rotates with a rotation shaft (not shown) passed through the central portion of the sheet, and is continuously fed.

The sheet cutting section 93 includes a sheet press 97, cutter receiver 98, cutter 99 disposed below the cutter receiver 98, and air cylinder 100 for reciprocating/moving the cutter 99. The sheet press 97 and cutter receiver 98 are raised/lowered by an elevating device (not shown).

While the fed portion 95a is fed by a predetermined dimension, the sheet cutting section 93 lowers the sheet press 97, and holds a root portion of the fed portion 95a between the press 97 and the guide roller 96. Subsequently, the sheet cutting section 93 lowers the cutter receiver 98 until the receiver contacts an upper surface of the fed portion 95a in an extended state. Finally, the sheet cutting section 93 drives the air cylinder 100 and allows the cutter 99 to cross the width direction of the fed portion 95a. Thereby, the sheet cutting section 93 obtains the second sealing sheet 22 cut into the rectangular shape having the predetermined dimension from the fed portion 95a.

After the cutting, in order to prepare for the next cutting operation, the sheet press 97 and cutter receiver 98 are returned to respective original raised positions, and the cutter 99 is returned to an original position by the air cylinder 100. The sheet press 97, cutter receiver 98, and cutter 99 returned to the respective original positions are disposed in order not to inhibit a sheet chuck 101 from moving as described later. The sheet cutting section 93 repeats the aforementioned cutting operation, and successively obtains the second sealing sheet 22 having the predetermined shape to be set on the substrate M1.

The sheet set section 94 includes a second transfer head 102 having the sheet chuck 101, and a moving device 103 of the head 102. Opposite ends of the head moving device 103 are supported by left and right supports 104 vertically disposed on the third conveyor 91, so that the device crosses the third conveyor 91. Only one support 104 is shown in FIG. 17B. One end of the head moving device 103 is positioned in the sheet cutting section 93.

The transfer head 102 is attached so as to be slidable along the longitudinal direction of the head moving device 103, and is reciprocated/moved in the width direction of the third conveyor 91 by a mechanism driving section (not shown) disposed in the head moving device 103. The sheet chuck 101 of the head 102 can be opened/closed by the operation of the air cylinder, and the like. The sheet chuck 101 opens/closes and can pinch the tip end of the fed portion 95a of the second sheet 95.

The head moving device 103 reciprocates/moves the transfer head 102 over the sheet receiving position and sheet covering position. In the sheet receiving position, the tip end of the fed portion 95a can be pinched by the sheet chuck 101 in the sheet cutting section 93. In the sheet covering position, the sheet chuck 101 is disposed right above the substrate M1 positioned in the third conveyor 91 by the first positioning mechanism.

The second sheet set apparatus 34 first pinches the tip end of the fed portion 95a in the sheet receiving position by the sheet chuck 101. Subsequently, while the pinched state is held, the second sheet set apparatus 34 moves the transfer head 102 to a predetermined position before the sheet covering position by the head moving device 103. Thereby, the fed portion 95a is drawn out in order to obtain a length suitable for the second sealing sheet 22. Thereafter, the second sheet set apparatus 34 lowers the sheet press 97 and holds the drawn fed portion 95a in the extended state. In this state, the second sheet set apparatus 34 drives the cutter 99 of the sheet cutting section 93, cuts the fed portion 95a, and obtains the second sealing sheet 22.

Subsequently, the second sheet set apparatus 34 moves the transfer head 102 to the sheet covering position by the head moving device 103, and then releases the second sealing sheet 22 pinched by the sheet chuck 101. Thereby, the second sealing sheet 22 can exactly be transferred onto the first sealing sheet 21 in the vicinity of the one side 11a of the substrate M1. By the aforementioned operation, the second sealing sheet 22 to be set on the substrate M1 transported into the third conveyor 91 is laminated.

In this case, one side edge of the second sealing sheet 22 is aligned with edges 21ae (see FIG. 3) of the pair of cutouts 21a of the first sealing sheet 21 and the second sealing sheet is laminated on the first sealing sheet 21. When the third conveyor 91 resumes the transport operation, the substrate M1 with the second sealing sheet 22 laminated thereon is transported to a tentative attachment position defined by a second positioning mechanism (not shown) in the third conveyor 91.

The second sheet set apparatus 34 includes a tentative attachment mechanism 105. The mechanism 105 is formed by attaching a pair of tentative attachment devices 107 to a bracket 106. The bracket 106 is disposed over the transport way at the downstream position with respect to the head moving device 103 of the sheet set section 94 in the transport direction. The tentative attachment device 107 includes a heater unit 107b raised/lowered by a cylinder 107a. A heater head 107c extending downwards from the unit 107b presses the second sealing sheet 22 positioned right below the head from above.

By the pressing, a portion of the first sealing sheet 21 disposed opposite to the heater head 107c is locally heated/molten, and the second sealing sheet 22 is bonded onto the first sealing sheet 21. Tentatively bonded portions are shown by A in FIG. 4. By the tentative attachment, since the light and thin second sealing sheet 22 is prevented from deviating from the predetermined position in the subsequent transport of the substrate, the photovoltaic module M can be inhibited from being degraded.

A substrate M2 with the second sealing sheet 22 tentatively attached thereto is transported to a fourth conveyor 110. The fourth conveyor 110 is continuously disposed to be adjacent to the third conveyor 91 at the downstream position with respect to the transport direction.

Figure 18:
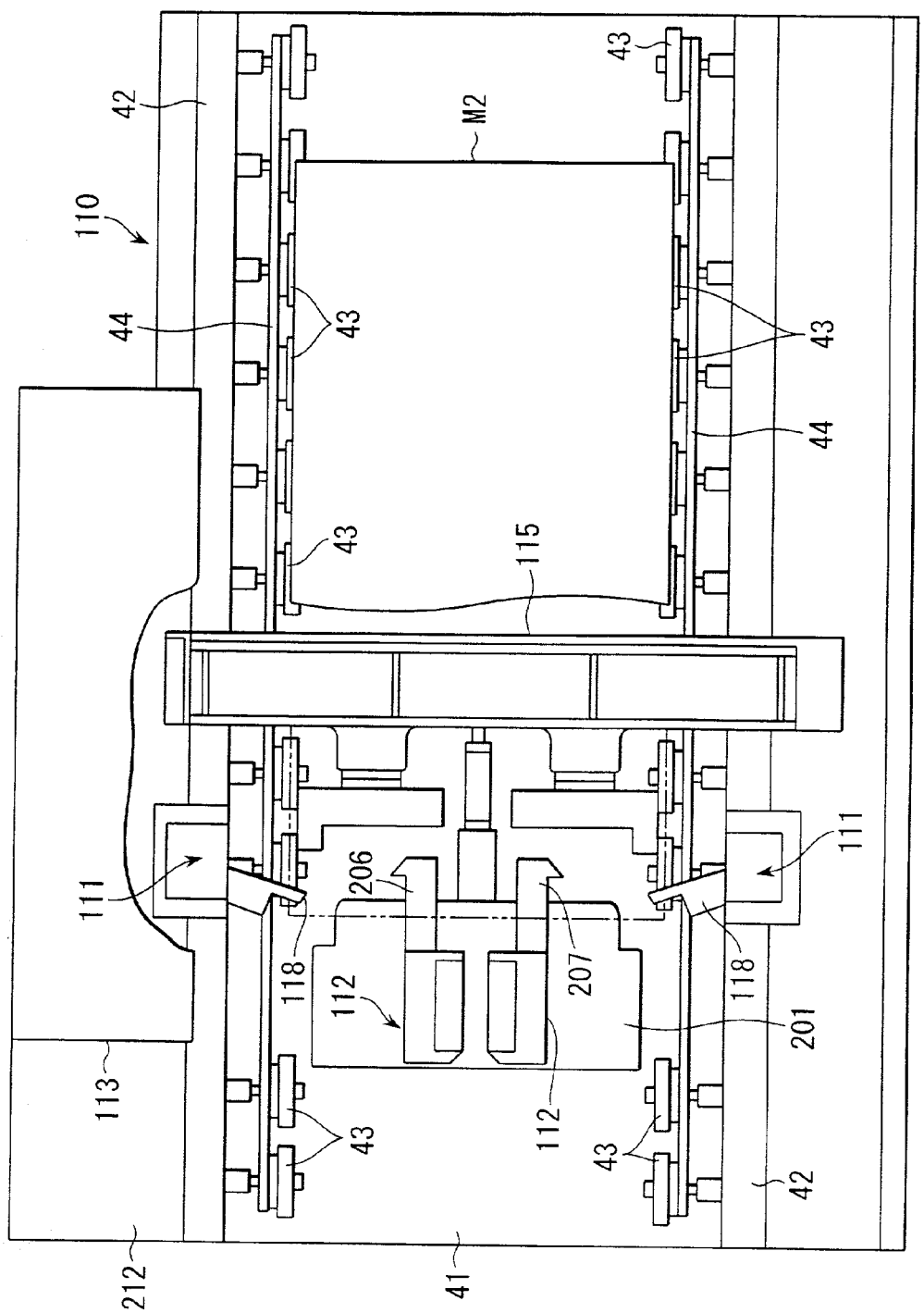
FIG. 18 is a partially cut plan view of an output lead wire set apparatus disposed in the sealing preparation apparatus of FIG. 10.

The fourth work stage S4 of the transport way is formed by the fourth conveyor 110 shown in FIG. 18. Since a constitution of the conveyor 110 is similar to that of the first conveyor 40 excluding the following respects, the same constitution as that of the first conveyor 40 is denoted with the same reference numerals, and description thereof is omitted. In the fourth conveyor 110, the lead wire receiving portions 46 are not disposed, but a positioning mechanism (not shown) for automatically positioning the substrate M2 in the predetermined position is disposed. The positioning mechanism includes a stopper, pusher, and the driving device of the stopper and pusher. The stopper is projected from below into the transport way of the substrate M2 transported by the fourth conveyor 110. The pusher pushes the substrate M2 positioned by the stopper from one side of the width direction.

As shown in FIG. 10, the output lead wire set apparatus 35 is disposed at the downstream position with respect to the second sheet set apparatus 34 in the transport direction of the substrate M1 with respect to the fourth work stage S4. As shown in FIGS. 18, 19A, 19B, 20 to 24, the output lead wire set apparatus 35 includes a pair of first bend guide sections 111, a pair of second bend guide sections 112, a drawing robot 113, and a press mechanism 115.

Figure 21:
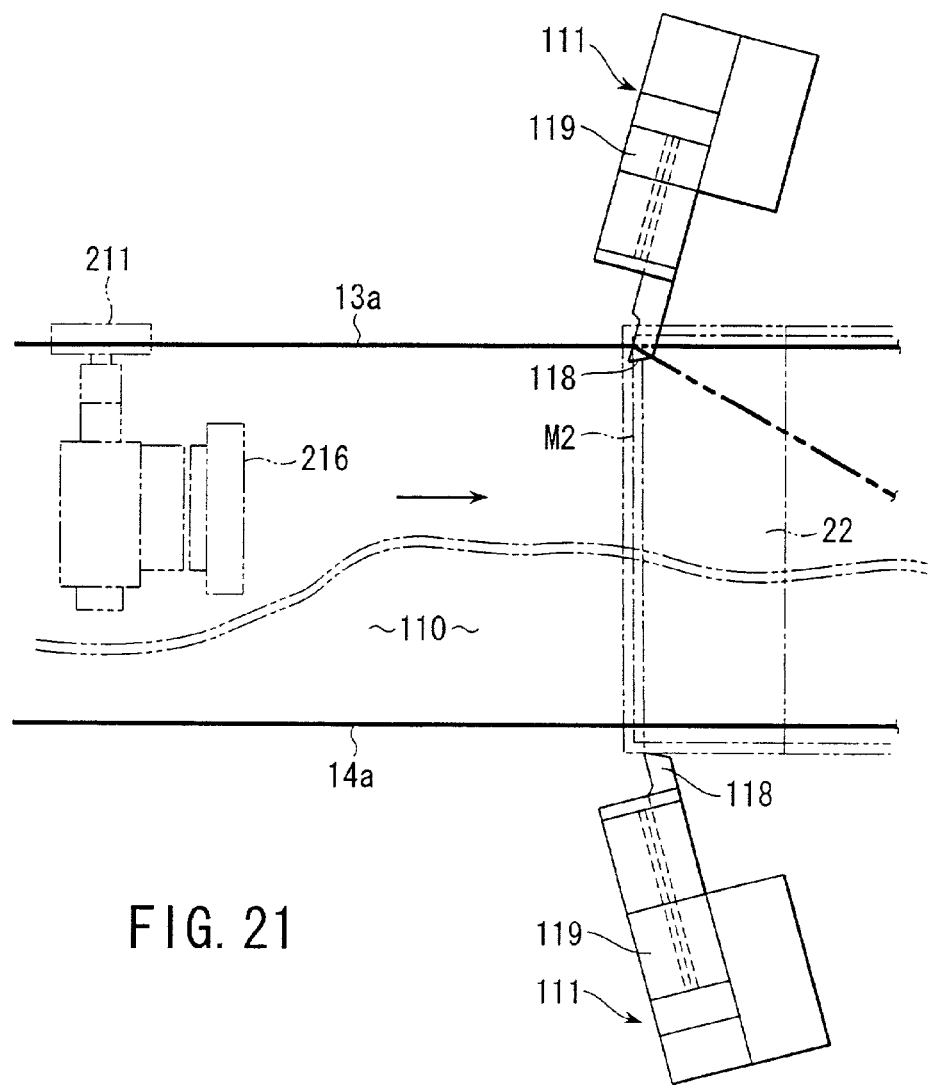
FIG. 21 is a plan view showing a first bend guide section disposed in the output lead wire set apparatus of FIG. 18.

As shown in FIGS. 18 and 21, the first bend guide sections 111 are attached to the conveyor frames 42 on opposite sides of the fourth conveyor 110. The bend guide section 111 includes a flat first guide plate 118, and a driving device 119 having an air cylinder for reciprocating/moving the guide plate 118. The first guide plate 118 is reciprocated/moved over a use position (see an upper state in FIG. 21) and a retreat position (see a lower state in FIG. 21). The first guide plate 118 is projected into the transport way of the substrate M2 by the fourth conveyor 110 in the use position, and deviates from the transport way in the retreat position.

In the use position, the first guide plate 118 overlaps and intersects the lead wires 13, 14 of the substrate M2 positioned by the first positioning mechanism. In the present embodiment, the first guide plate 118 diagonally intersects the lead wires 13, 14. According to this arrangement, the first guide plate 118 is used as a reference in bending the output lead wires 13a, 14a in a turned-up manner. When both the first bend guide sections 111 are used, the pair of first guide plates 118 are alternately projected into the transport way. However, when both the first bend guide sections 111 are unused, both the first guide plates 118 are positioned in the retreat position in order not to hinder the substrate M2 from being transported.

Figure 22:
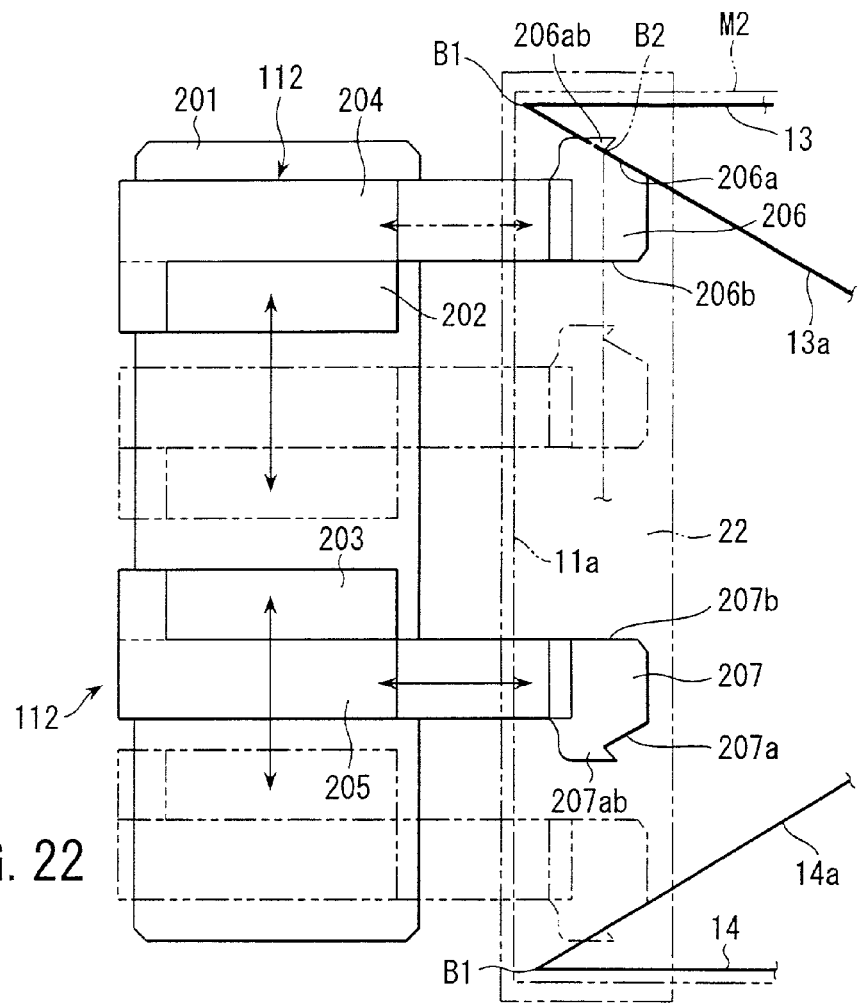
FIG. 22 is a plan view showing a second bend guide section disposed in the output lead wire set apparatus of FIG. 18.

The second bend guide section 112 is disposed so that the section can be raised/lowered over raised and lowered positions. The second bend guide section 112 disposed in the lowered position does not hinder the substrate M2 from being transported. The second bend guide section 112 in the raised position is disposed in the transport way of the substrate M2 positioned by the first positioning mechanism (not shown) with respect to one side 11a. As shown in FIGS. 18 and 22, the second bend guide section 112 includes an elevating base 201, a pair of movable bases 202, 203, a pair of guide plate holders 204, 205, and a pair of second guide plates 206, 207.

The elevating base 201 raised/lowered by an elevating air cylinder (not shown) is moved over the lowered and raised positions. The pair of movable bases 202, 203 are mounted on the elevating base 201. The movable bases 202, 203 are disposed so that the bases can reciprocate/move in the width direction (shown by a solid-line arrow in FIG. 22) of the fourth conveyor 110 by an air cylinder for crossing (not shown). The air cylinder for crossing is connected individually to the movable bases 202, 203, and incorporated in the elevating base 201.

The movable base 202 includes the guide plate holder 204 vertically moved by an air cylinder for slight vertical movement (not shown) incorporated in the base. The second guide plate 206 is attached to the guide plate holder 204. The second guide plate 206 is moved along the transport direction (shown by a two-dot chain line arrow in FIG. 22) by an air cylinder for guide plate movement (not shown) incorporated in the guide plate holder 204.

The other movable base 203 includes the other guide plate holder 205 vertically moved by another air cylinder for slight vertical movement (not shown) incorporated in the base. The other second guide plate 207 is attached to the guide plate holder 205. The second guide plate is moved along the transport direction (shown by the two-dot chain line arrow in FIG. 22) by another air cylinder for guide plate movement (not shown) incorporated in the guide plate holder 205.

Therefore, the pair of second guide plates 206, 207 can three-dimensionally move. One-side portions 206a, 207a of these second guide plates 206, 207 are used as references in bending the output lead wires 13a, 14a on a central portion of the width direction of the substrate M2. The one-side portions 206a, 207a have oblique sides and wire press portions 206ab, 207ab continuously bent from the sides as shown in FIG. 22. Other side portions 206b, 207b of the second guide plates 206, 207 are used as references in bending the output lead wires 13a, 14a in an erected manner from the substrate M2.

The drawing robot 113 three-dimensionally moves a drawing chuck 211, and draws around the output lead wires 13a, 14a pinched by the chuck 211. Thereby, the output lead wires 13a, 14a are bent and turned up using the first guide plate 118 as the reference, subsequently bent toward the central portion of the width direction of the substrate M2 using the oblique sizes of the one-side portions 206a, 207a of the second guide plates 206, 207 as the references, and finally bent upwards using the other side portions 206b, 207b as the references.

Figure 19A:
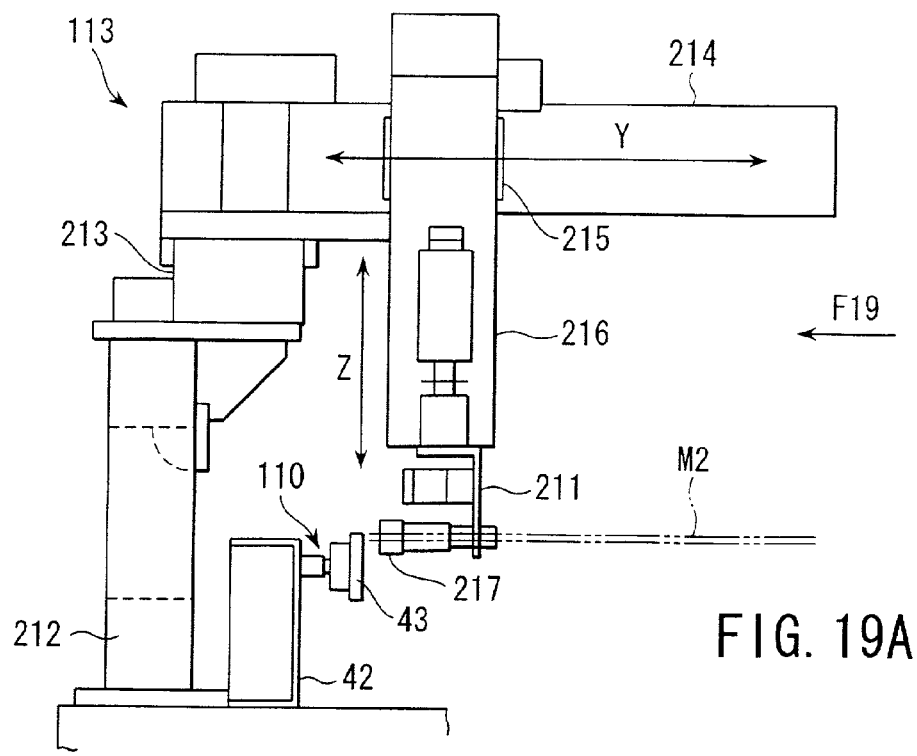
FIG. 19A is a front view showing a wire drawing robot disposed in the output lead wire set apparatus of FIG. 18.
Figure 19B:
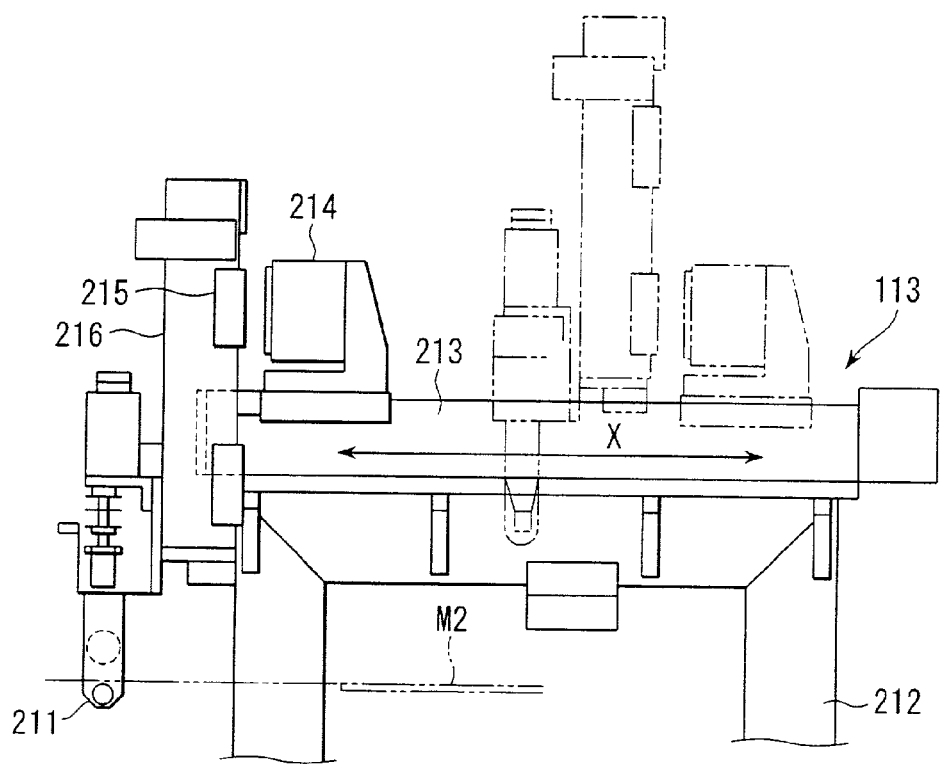
FIG. 19B is a view of the wire drawing robot seen from a direction of an arrow F19 of FIG. 19A.

As shown in FIGS. 19A and 19B, the drawing robot 113 includes a guide 213 of a robot base 212, and a movable arm 214. The guide 213 extends along the transport direction of the substrate M2. The movable arm 214 slides along the guide 213 in a direction of an arrow X in FIG. 19B. The movable arm 214 extends in the width direction of the fourth conveyor 110. A moving object 215 which slides in a longitudinal direction of the arm 214, that is, in a direction of an arrow Y in FIG. 19A is attached to the movable arm 214. A vertically extending chuck holder 216 is attached to the moving object 215 so that the holder can be raised/lowered in a direction of an arrow Z in FIG. 19A. The drawing chuck 211 is attached to the chuck holder 216. Therefore, with movement of the movable arm 214, moving object 215, and chuck holder 216, the drawing chuck 211 can three-dimensionally move.

Figure 20:
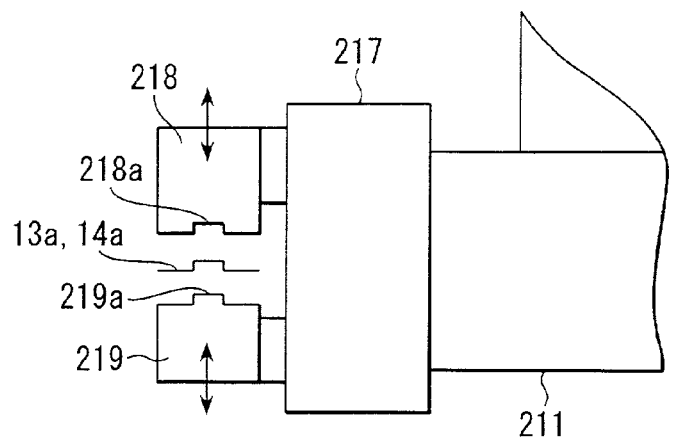
FIG. 20 is a side view showing a drawing chuck disposed in the wire drawing robot of FIGS. 19A and 19B.

FIG. 20 shows a chuck head 217 of the drawing chuck 211. The head 217 can revolve in a predetermined angle range using a step motor, and the like as a driving source so that the head has an optimum direction in a wire drawing operation as described later. A pair of pinching pieces 218, 219 protruding from the chuck head 217 can be attached to/detached from each other, and the output lead wires 13a, 14a can be pinched and released with the attachment/detachment.

As shown in FIG. 20, one of opposite pinching surfaces of the pinching pieces 218, 219 is formed in a concave surface 218a, and the other surface is formed in a convex surface 219a. With convex/concave engagement, the output lead wires 13a, 14a can be pinched. The pinched output lead wires 13a, 14a can be transformed by the convex/concave engagement. Therefore, the output lead wires 13a, 14a can advantageously be prevented from slipping out of the wire drawing chuck 211.

The output lead wire set apparatus 35 performs an automatic bending operation of the output lead wires 13a, 14a while the substrate M2 is positioned in the predetermined position of the fourth conveyor 110 by the positioning mechanism.

First, among the first bend guide sections 111, for example, the driving device 119 of the first bend guide section 111 positioned on an upper side in FIG. 21 is operated. Thereby, the first guide plate 118 is projected into the transport way of the substrate M2, and intersects and overlaps the root portion of the output lead wire 13a of the substrate M2.

Thereafter, the wire drawing robot 113 is operated. In this manner, the wire drawing chuck 211 is first moved to the pinching position of the output lead wire 13a, the pinching pieces 218, 219 are brought close to each other in this position, and a portion in the vicinity of a root of the output lead wire 13a is pinched. Subsequently, while the pinching state is kept, the wire drawing chuck 211 is moved toward a tip end of the output lead wire 13a, and the tip end of the output lead wire 13a is pinched. Therefore, the output lead wire 13a is ironed out and straightened. The output lead wire 13a is advantageously straightened, so that the output lead wire 13a can securely be drawn and bent by the wire drawing chuck 211 as described later.

Figure 5A:
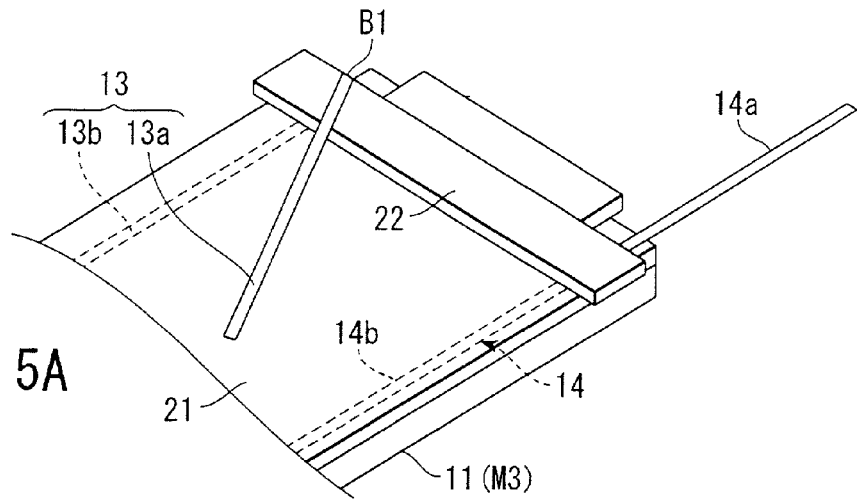
FIG. 5A is a perspective view showing that one of output lead wires of FIG. 4 is bent for a first time.
Figure 5B:
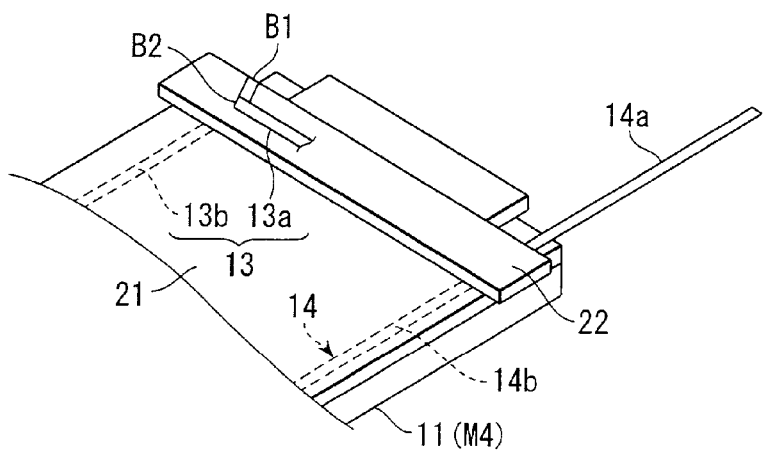
FIG. 5B is a perspective view showing that the output lead wire of FIG. 4 is bent for a second time.

Subsequently, the wire drawing chuck 211 draws and moves the output lead wire toward the other output lead wire 14a on the downstream side from the first guide plate 118 in the transport direction (shown by an arrow in FIG. 21) of the substrate M2. Thereby, the portion in the vicinity of the root portion of the output lead wire 13a is turned back to overlap the first guide plate 118 in the use position. This state is shown in FIG. 21 and FIG. 5A. A bend formed by a first bending is referred to as a first bent portion B1. The substrate subjected to the first bending is referred to as a substrate M3.

Thereafter, the driving device 119 of the first bend guide section 111 returns the first guide plate 118, and retreats the guide plate 118 to the retreat position from the use position. Subsequently, the second bend guide section 112 corresponding to the first bend guide section 111 is operated, and the second guide plate 206 is three-dimensionally moved. Thereby, as shown by an upper part of FIG. 22, the second guide plate 206 is moved forward and disposed in a first press position in which the one-side portion 206a of the second guide plate 206 presses the root portion of the output lead wire 13a, that is, a portion in the vicinity of the first bent portion B1 from above.

In this state, the wire drawing robot 113 is operated, and the wire drawing chuck 211 pinching the output lead wire 13a is drawn/moved and positioned in the central portion of the width direction of the substrate M3. Thereby, the output lead wire 13a is bent on a side of the other output lead wire 14a using the oblique side of the one-side portion 206a of the second guide plate 206 in the first press position as the reference. This state is shown by the two-dot chain line in FIG. 22, and FIG. 5B. A bend formed by the second bending is referred to as a second bent portion B2. The bent portion B2 is positioned on the second sealing sheet 22. The substrate subjected to the second bending is referred to as a substrate M4.

Subsequently, the second bend guide section 112 in the upper part of FIG. 22 is operated, the second guide plate 206 is drawn back from the first press position and once pulled out, and the guide plate 206 is three-dimensionally moved again. Thereby, the second guide plate 206 is disposed in a second press position shown by the two-dot chain line in the upper part of FIG. 22. Thereby, the other side portion 206b of the second guide plate 206 presses a middle portion of the output lead wire 13a.

Figure 5C:
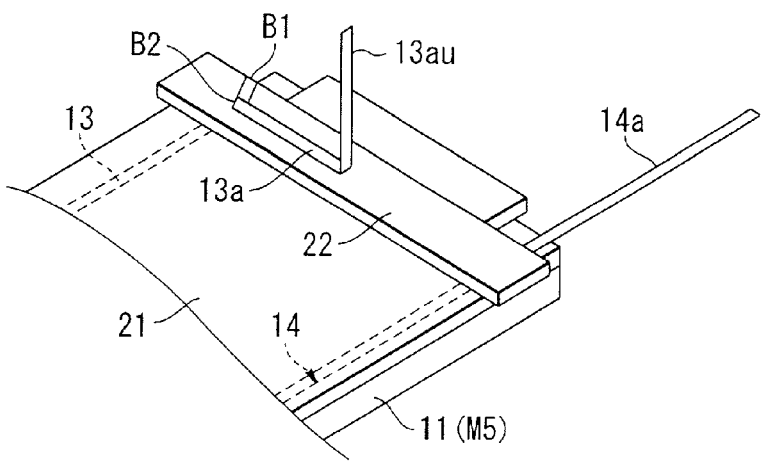
FIG. 5C is a perspective view showing that the output lead wire of FIG. 4 is bent for a third time.

The wire drawing robot 113 is operated in this state, and the wire drawing chuck 211 pinching the output lead wire 13a is drawn/moved and positioned right above the second guide plate 206 in the second press position. Thereby, the output lead wire 13a is bent upwards using the other side portion 206b of the second guide plate 206 used as the reference so as to substantially vertically rise. This state is shown in FIG. 5C. The substrate subjected to the third bending is referred to as a substrate M5. After the output lead wire 13a is automatically bent, the second bend guide section 112 is returned to the original standby position, and the wire drawing robot 113 releases the pinched output lead wire 13a and returns to the original standby position.

Figure 6A:
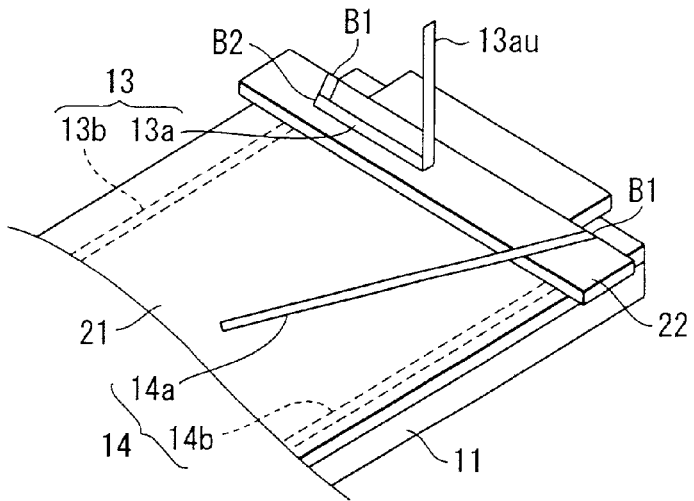
FIG. 6A is a perspective view showing that the other output lead wire of FIG. 4 is bent for the first time.

Subsequently, the output lead wire set apparatus 35 automatically bends the other output lead wire 14a on the second sealing sheet 22 similarly as the automatic bending of the output lead wire 13a. That is, for brief description, the first bending is performed using the first guide plate 118 of the other first bend guide section 111 projected into the use position as the reference. FIG. 6A shows a state of the first bending.

Figure 6B:
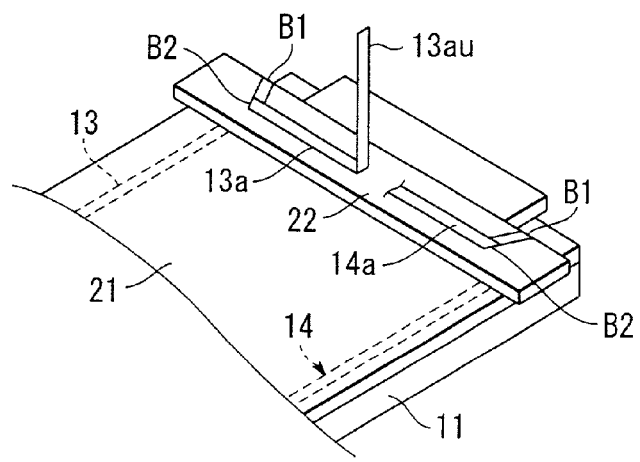
FIG. 6B is a perspective view showing that the other output lead wire of FIG. 4 is bent for the second time.
Figure 6C:
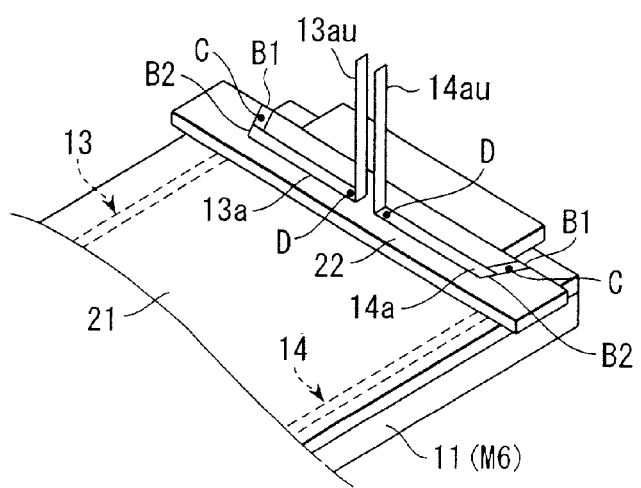
FIG. 6C is a perspective view showing that the other output lead wire of FIG. 4 is bent for the third time.

The second bending is performed using the one side portion 207a of the second guide plate 207 of the other second bend guide section 112. FIG. 6B shows a state of the second bending. The third bending is performed using the other side portion 207b of the second guide plate 207 disposed in the second press position as the reference. FIG. 6C shows a state of the third bending.

The operation of the other first bend guide section 111, other second bend guide section 112, and wire drawing robot 113 in these first to third bending is the same as that of the automatic bending of the output lead wire 13a. Therefore, description is omitted, and the first and second bent portions formed by the bending are also denoted with the same reference numerals in FIGS. 6A to 6C. The substrate subjected to the automatic bending of the pair of output lead wires 13a, 14a in the output lead wire set apparatus 35 as described above is referred to as a substrate M6.

In the present invention, for the aforementioned automatic bending of the pair of output lead wires 13a, 14a, contrary to the present embodiment, the output lead wire 14a may first be bent and the output lead wire 13a may be bent later. In the present invention, when two wire drawing robots 113 are disposed, the operations are substantially simultaneously performed, and a treatment time can be shortened. However, a constitution in which one wire drawing robot 113 is for common use in automatically bending the pair of output lead wires 13a, 14a as in the present embodiment, equipment cost can be reduced. The constitution can advantageously contribute to the cost reduction.

Figure 23:
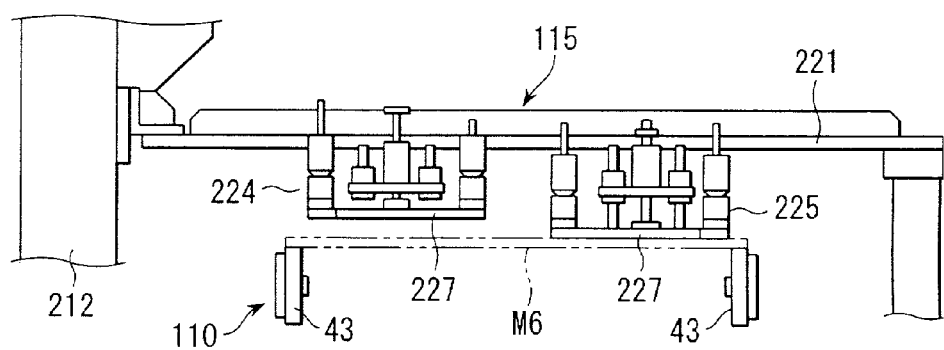
FIG. 23 is a front view showing a pair of press sections disposed in the output lead wire set apparatus of FIG. 18.
Figure 24A:
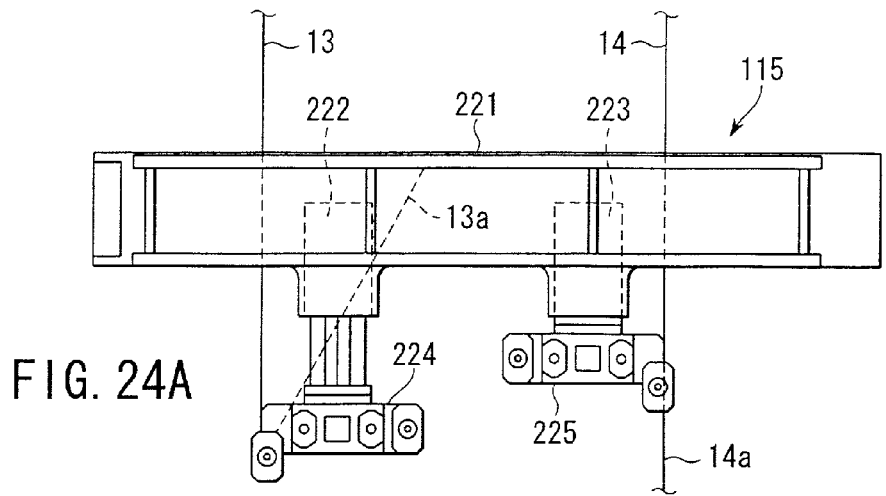
FIG. 24A is a plan view showing the press section of FIG. 23.

The press mechanism 115 is disposed on the downstream side from the section for the automatic bending in the transport direction of the substrate. As shown in FIGS. 23 and 24A, the press mechanism 115 includes a bracket 221, a pair of moving devices 222, 223, and a pair of press devices 224, 225. The bracket 221 is disposed across the transport way of the fourth conveyor 110 as shown in FIG. 23. The moving devices 222, 223 are incorporated in the bracket 221. The press devices 224, 225 are individually attached to these moving devices 222, 223.

The moving device 222 and supported press device 224 are disposed for the output lead wire 13a. The other moving device 223 and supported press device 225 are disposed for the other output lead wire 14a. The moving devices 222, 223 constituted of the air cylinder, and the like reciprocate/move the press devices 224, 225 over a forward position and a backward position for standby along the transport direction of the substrate M6. The arrangement in the forward position is represented by the press device 224 on a left side of FIG. 24A. The arrangement in the backward position is represented by the press device 225 on a right side of FIG. 24A.

Figure 24B:
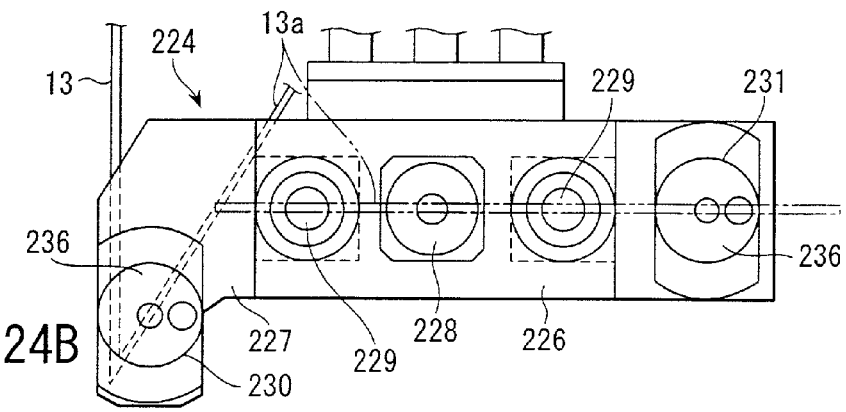
FIG. 24B is an enlarged plan view of a press device disposed in the press section of FIG. 23.
Figure 24C:
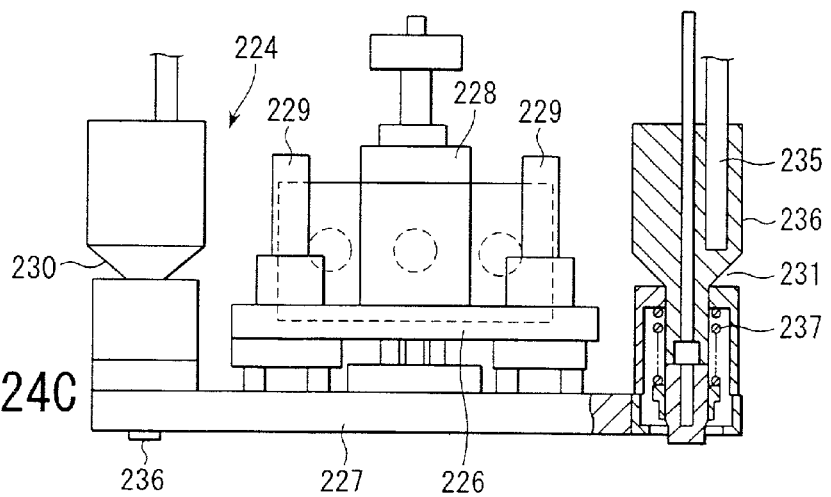
FIG. 24C is a partially sectional front view of the press device of FIG. 23B.

As shown in FIGS. 24B and 24C, the press devices 224, 225 include a base 226, a press plate 227, an elevating device 228, a plurality of guide shafts 229, and a pair of heater units 230, 231. The base 226 is connected to the moving devices 222, 223. The press plate 227 as one example of a press member is disposed below the base 226, and is formed in a substantial L shape. The elevating device 228 is constituted of the air cylinder, and the press plate 227 is attached to the base 226 so that the plate can be raised/lowered. The respective guide shafts 229 guide the raised/lowered plate 227. The heater units 230, 231 are attached to opposite ends of the press plate 227.

The press plate 227 is raised/lowered over standby and lowered positions by the elevating unit 228. As represented by the press device 224 on the left side of FIG. 23, the standby position is a position in which the plate is raised not to hinder the substrate M6 from being transported. As represented by the press device 225 on the right side of FIG. 23, the lowered position is a position in which the bent output lead wire 13a or 14a can be pressed onto the substrate 11. The press plate 227 can press the first and second bent portions B1, B2 of the output lead wires 13a, 14a. The press plate 227 has such a size that the plate does not contact upward portions 13au, 14au of the output lead wires 13a, 14a.

When the press plate 227 is lowered, one heater unit 230 is pressed between the bent portions B1 and B2 of the output lead wires 13a, 14a. Similarly, when the press plate 227 is lowered, the other heater unit 231 is pressed onto a portion in the vicinity of the upward portions 13au, 14au of the output lead wires 13a, 14a. The heater units 230, 231 are constituted similarly as the heater unit 107b. In detail, as shown in FIG. 24C, the heater unit includes a heater element 235, a heater main body 236 with the element 235 incorporated therein, and a spring 237 for biasing the main body 236 downwards. A lower end of the heater main body 236 forms a heater head 236a, and the head 236a is pressed onto the output lead wires 13a, 14a from above.

When the heater head 236a is pressed, a portion of the first sealing sheet 21 disposed opposite to the heater head is locally molten. The second sealing sheet 22 of nonwoven fabric is impregnated with the molten portion. Thereby, the bent output lead wires 13a, 14a can be bonded onto the second sealing sheet 22. Tentatively bonded portions are shown by C, D in FIG. 6C. The tentatively bonded portions can inhibit the output lead wires 13a, 14a from fluctuating in the subsequent substrate transport.

The press mechanism 115 moves forwards the press devices 224, 225 by the moving devices 222, 223, and lowers the press plate 227 by the elevating device 228. In this case, the heater units 230, 231 are energized.

Thereby, the press plate 227 of the press device 224 presses the output lead wire 13a between the plate and the substrate M6. The press plate 227 of the other press device 225 presses the output lead wire 14a between the plate and the substrate M6. Therefore, the first and second bent portions B1, B2 of the output lead wires 13a, 14a are pressed and folded.

After the bent portions B1, B2 are folded, portions of the sealing layer 15 corresponding to the folded portions are inhibited from being higher than other portions, and the bent portions B1, B2 can be prevented from being factors for degrading the photovoltaic module M. The energized heater units 230, 231 generate heat and are pressed onto the output lead wires 13a, 14a. Therefore, the first sealing sheet 21 is locally heated/molten, and the tentatively bonded portions C, D, of the bent output lead wires 13a, 14a can be bonded onto the second sealing sheet 22.

After the aforementioned folding/bonding operation ends, the press plates 227 of the press devices 222, 223 both rise and return to the standby position. Thereafter, both the press devices 222, 223 retreat toward the bracket 221, return to the initial state, and are prepared for the next operation. When the transport operation of the fourth conveyor 110 restarts, and a fifth conveyor 240 performs a transport operation, the substrate M6 subjected to the folding/bonding is transported to the fifth conveyor 240. The fifth conveyor 240 is continuously disposed to be adjacent to the fourth conveyor 110 at the downstream position with respect to the transport direction.

In the constitution of the present embodiment, as described above, the position where the output lead wires 13a, 14a are bent is the same as the position wherein the folding/bonding is performed, and the press devices 224, 225 are moved to the position. Therefore, a length of the fourth conveyor 110 can be reduced, and a single positioning mechanism of the substrate is advantageously sufficient. However, instead of the constitution, the fourth conveyor 110 may include a first positioning mechanism, and a second positioning mechanism which deviates from the first positioning mechanism toward at the downstream position with respect to the transport direction. The first positioning mechanism positions the substrate in a position suitable for the automatic bending. In the second positioning mechanism, the substrate M6 is positioned at the press position suitable for the folding/bonding by the stopper projected from below into the transport way of the substrate M6 transported by the fourth conveyor 110. The press mechanism 115 constituted in this manner can obviate necessity of a constitution for moving the press plate 227 backwards and forwards. Therefore, since the elevating device 228 can directly be attached to the bracket 221, the constitution of the press mechanism 115 can be simplified.

Figure 26:
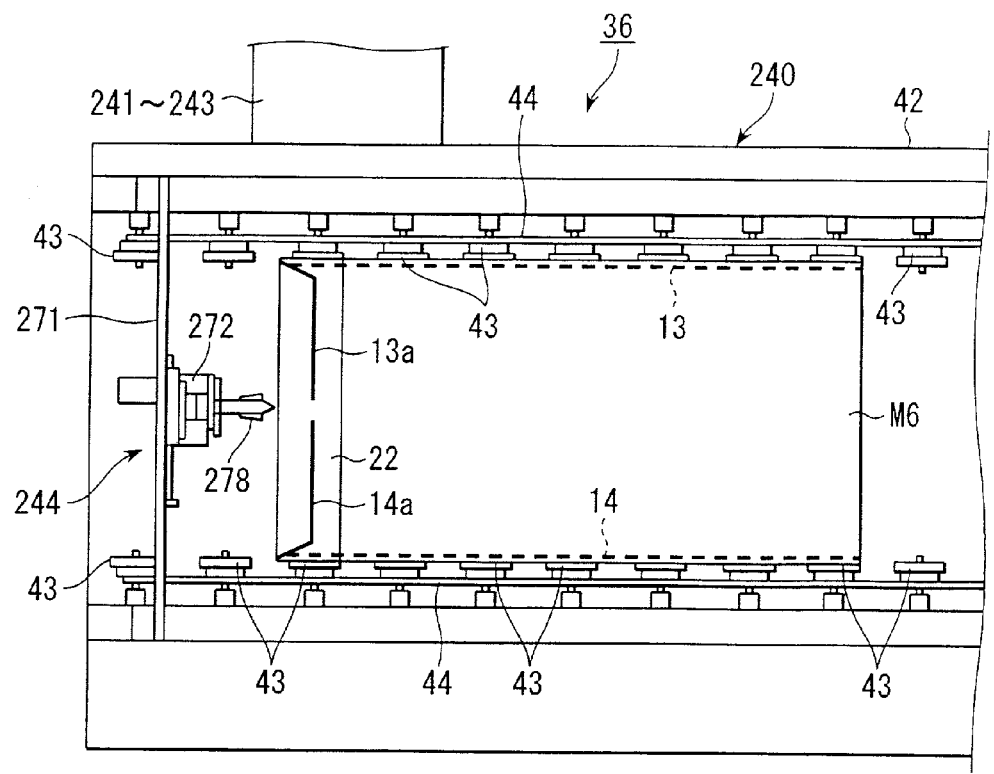
FIG. 26 is a plan view showing an arrangement of a wire support section disposed in the third sheet set apparatus of FIG. 25.

The fifth work stage S5 of the transport way 32 is formed of the fifth conveyor 240 shown in FIG. 26. Since a constitution of the conveyor 240 is similar to that of the first conveyor 40 excluding the following respects, the same constitution as that of the first conveyor 40 is denoted with the same reference numerals, and description thereof is omitted. In the fifth conveyor 240, the lead wire receiving portions 46 are not disposed, but a positioning mechanism (not shown) for automatically positioning the substrate M6 in the predetermined position is disposed. The positioning mechanism includes a stopper, pusher, and the driving device of the stopper and pusher. The stopper is projected from below into the transport way of the substrate M6 transported by the fifth conveyor 240. The pusher pushes the substrate M6 positioned by the stopper from one side of the width direction.

As shown in FIG. 10, the third sheet set apparatus 36 is disposed for the fifth work stage S5 along one side of the width direction of the transport way 32, and the apparatus 36 is disposed at the downstream position with respect to the second sheet set apparatus 35 in the transport direction. As shown in FIGS. 25 to 29, the third sheet set apparatus 36 includes a sheet supply section 241, sheet cutting section 242, sheet set section 243, and wire support section 244. The set apparatus 36 cuts the third sealing sheet 21 which has substantially the same shape as that of the second sealing sheet 22 from a third sheet 245, and covers the substrate M6 positioned in the fifth work stage S5 with the third sealing sheet 23 from above.

Figure 25:
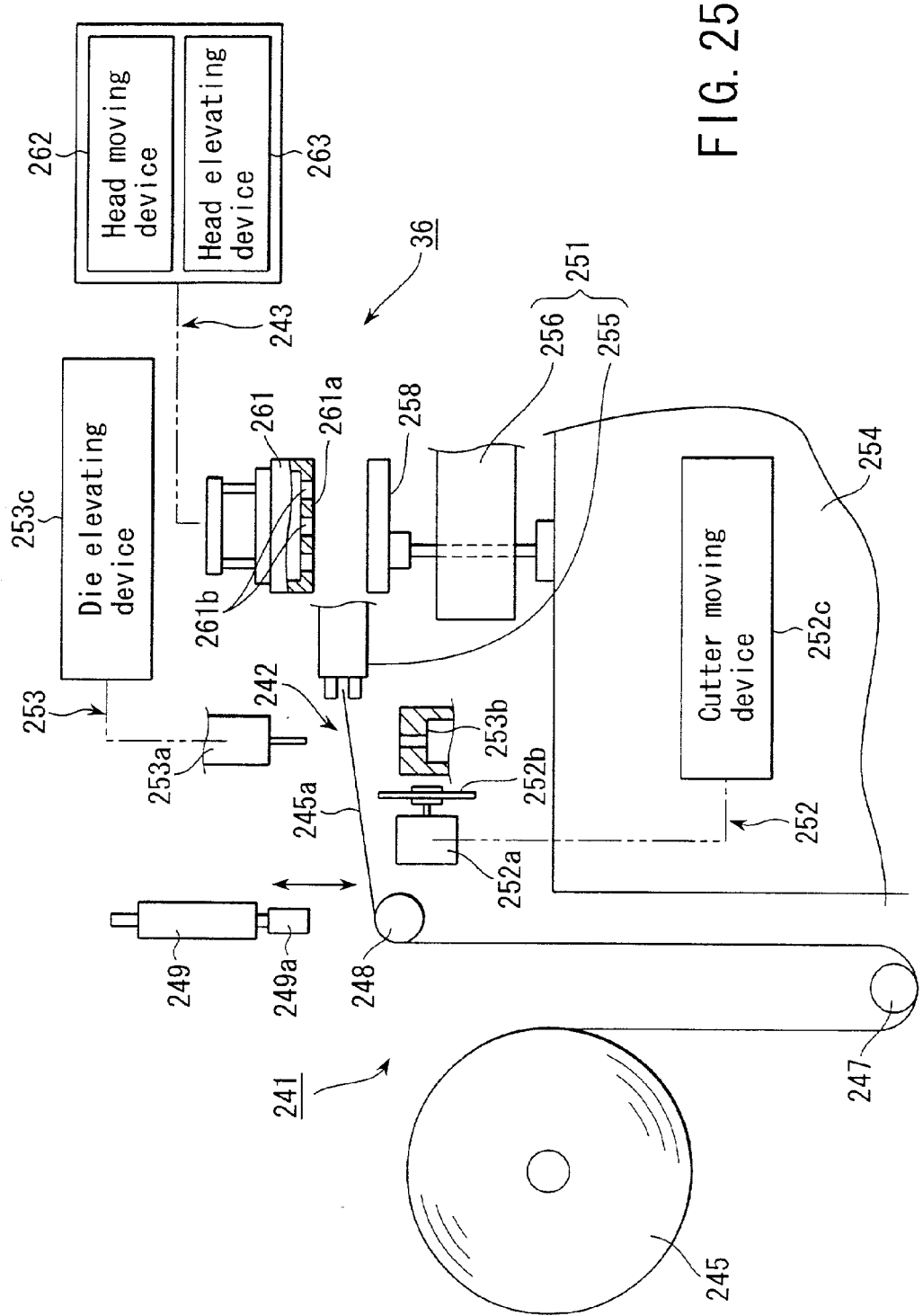
FIG. 25 is a side view schematically showing a third sheet set apparatus disposed in the sealing preparation apparatus of FIG. 10.

The sheet supply section 241 has a constitution similar to that of the sheet supply section 51 of the first sheet set apparatus 33. As shown in FIG. 25, the sheet supply section 241 includes a dancer roller 247, guide roller 248, and press cylinder 249 of the air type. The dancer roller 247 guides a fed portion 245a of the third sheet 245 wound in the roll shape, while applying a tension on the feed portion 245a. The guide roller 248 is disposed above the dancer roller 247. A width of the third sheet 245 is substantially the same as that of the second sealing sheet 22. The fed portion 245a of the sheet 245 is guided into the sheet cutting section 242 via the dancer roller 247 and guide roller 248. When the fed portion 245a is pulled in a feeding direction, the third sheet 245 freely rotates with a rotation shaft (not shown) passed through the central portion of the sheet and the feeding is continued. The press cylinder 249 is disposed right above the guide roller 248. The cylinder 249 lowers a press head 249a, and sandwiches the fed portion 245a with the guide roller 248.

The sheet cutting section 242 includes a sheet drawing mechanism 251, first cutting mechanism 252, and second cutting mechanism 253. The sheet drawing mechanism 251 includes a chuck moving device 256, and sheet chuck 255. The chuck moving device 256 is fixed onto an apparatus base 254 disposed along the fifth conveyor 240. The sheet chuck 255 moved by the chuck moving device 256 has an openable/closable tip end for pinching a tip end of the fed portion 245a.

The chuck moving device 256 reciprocates/moves the sheet chuck 255 over a pinching position (see a position of the sheet chuck 255 shown by a solid line in FIG. 25) and a first drawing position. The chuck moving device 256 pinches the fed portion 245a in the pinching position. In the first drawing position, the fed portion 245a is cut/treated by the first cutting mechanism 252 and the third sealing sheet 23 is obtained. The chuck moving device 256 reciprocates/moves the sheet chuck 255 to the second drawing position from the first drawing position. In the second drawing position, the third sealing sheet 23 is cut/treated by the second cutting mechanism 253. The chuck moving device 256 moves the sheet chuck 255 to the third drawing position from the second drawing position. In the third drawing position, the third sealing sheet 23 is transferred onto a predetermined position on a support table 258 disposed on the apparatus base 254. The sheet chuck 255 can move to the pinching position from the third drawing position.

The first cutting mechanism 252 and second cutting mechanism 253 are disposed between the guide roller 248 and the pinching position, and mounted on the apparatus base 254. The first cutting mechanism 252 includes a rotation blade 252b driven by a motor 252a, and a cutter moving device 252c. The cutter moving device 252c reciprocates/moves the motor 252a and rotation blade 252b along the width direction of the fed portion 245a. With the movement, the fed portion 245a drawn to the first drawing position is cut, and the third sealing sheet 23 is formed.

The second cutting mechanism 253 includes a pair of upper and lower blanking dies 253a, 253b, and a die elevating device 253c. The blanking dies 253a, 253b are disposed at the downstream position with respect to the transport direction of the substrate 11 with respect to the first cutting mechanism 252. The die elevating device 253c raises/lowers the upper blanking die 253a with respect to the lower blanking die 253b. The cutting mechanism 233 forms a pair of holes 257 (see FIGS. 7 and 10) as a first wire passing portion in a substantially central portion of the third sealing sheet 23 with the cutting operation by blanking. The holes are made while the third sealing sheet 23 is drawn to the second drawing position.

The sheet cutting section 242 first draws the fed portion 245a of the third sheet 245 to the first drawing position, and the first cutting mechanism 252 is operated in this state. The obtained sheet is drawn/moved to the second drawing position, the second cutting mechanism is next operated, and the holes are made in the sheet 23. This operation is repeated. The sheet cutting section 242 successively obtains the third sealing sheet 23 having a predetermined shape to be set on the substrate M6.

As shown in FIG. 25, the sheet set section 243 includes a third vacuum suction type transfer head 261, head moving device 262, and head elevating device 263. The transfer head 261 includes a wall 261a which has the same size or a larger size as compared with the size of the third sealing sheet 23. The wall 261a forms a lower surface of the transfer head 261, and has a flat surface. In the wall 261a, a large number of suction holes 261b are disposed in the whole area, that is, in substantially the same range as that of the third sealing sheet 23. The transfer head 261 has a concave portion formed through a thickness direction (not shown in FIG. 25, but a transfer head 311 having a similar constitution is described later and represented by FIG. 31A). The concave portion is disposed to avoid interference with a support chuck 278 described later and upward portions 13au, 14au. The transfer head 261 is connected to a vacuum suction source (not shown) via a flexible tube which does not inhibit the head 261 from moving.

The head moving device 262 and head elevating device 263 have configurations similar to those of the head moving device 72 and head elevating device 73 of the first sheet set apparatus 33, and therefore description thereof is omitted to avoid redundant description. The transfer head 261 connected to the head elevating device 263 is reciprocated/moved over the sheet receiving position and sheet covering position, and raised/lowered by the head moving device 262 in both the positions. The transfer head 261 is disposed right above the support table 258 in the sheet receiving position. The transfer head 261 is disposed right above the substrate M6 positioned by the fifth conveyor 240 in the sheet covering position.

The transfer head 261 raised in the sheet receiving position is disposed above the transport way of the sheet chuck 255. The transfer head 261 lowered in the sheet receiving position holds the whole cut third sealing sheet 23 with the support table 258. The transfer head 261 is evacuated, while holding the third sealing sheet 23. The third sealing sheet 23 can therefore be attracted to the transfer head 261.

The transfer head 261 raised in the sheet covering position is correctly positioned right above and opposite to the second sealing sheet 22 with which the substrate M6 is covered. The transfer head 261 lowered in the sheet covering position holds the whole third sealing sheet 23 with the substrate M6. After the transfer head 261 stops attracting the sheet, while the sheet 23 remains head between the head 261 and the substrate M6, it is raised, the third sealing sheet 23 in reliably be transferred onto the substrate M6, cover the substrate M6.

Figure 7:
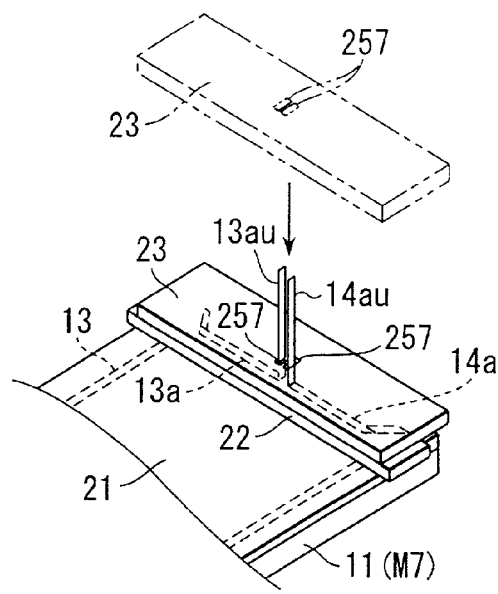
FIG. 7 is a perspective view showing that a third sealing sheet is set on a laminate of FIG. 6C.
Figure 8:
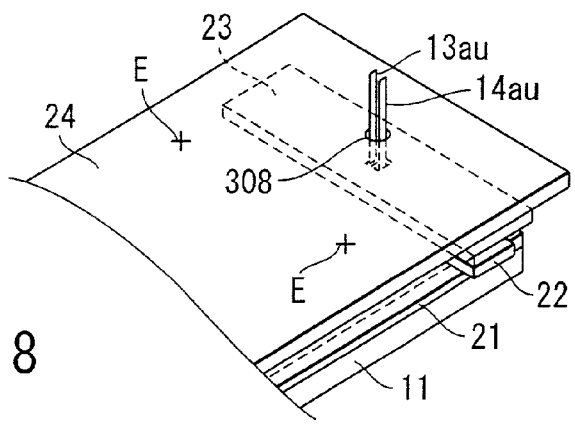
FIG. 8 is a perspective view showing that a fourth sealing sheet is set on the laminate of FIG. 7.

FIG. 7 shows that the substrate M6 is covered with the third sealing sheet 23 by the third sheet set apparatus 36. In the sheet setting, the wire support section 244 is used to pass the upward portions 13au, 14au of the output lead wires 13a, 14a through the holes 257 of the third sealing sheet 23.

The wire support section 244 will be described with reference to FIGS. 26 to 29. The support section 244 is formed by attaching a wire support mechanism 272 to a bracket 271 disposed across the transport way of the fifth conveyor 240 as shown in FIG. 26. The bracket 271 is disposed on the upstream side of the transport direction of the substrate M6 positioned in the fifth conveyor 240. The wire support mechanism 272 linearly holds the upward portions 13au, 14au of the output lead wires 13a, 14a, so that the upward portions are securely passed through the holes 257 of the third sealing sheet 23.

Figure 27:
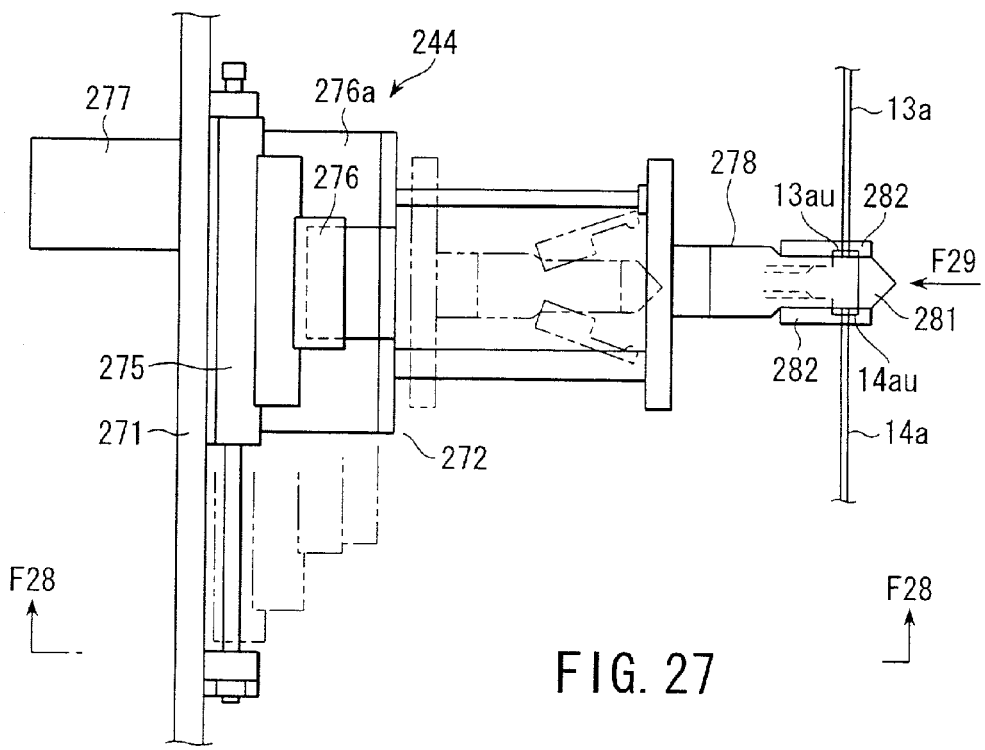
FIG. 27 is an enlarged side view showing the wire support section of FIG. 26.
Figure 28:
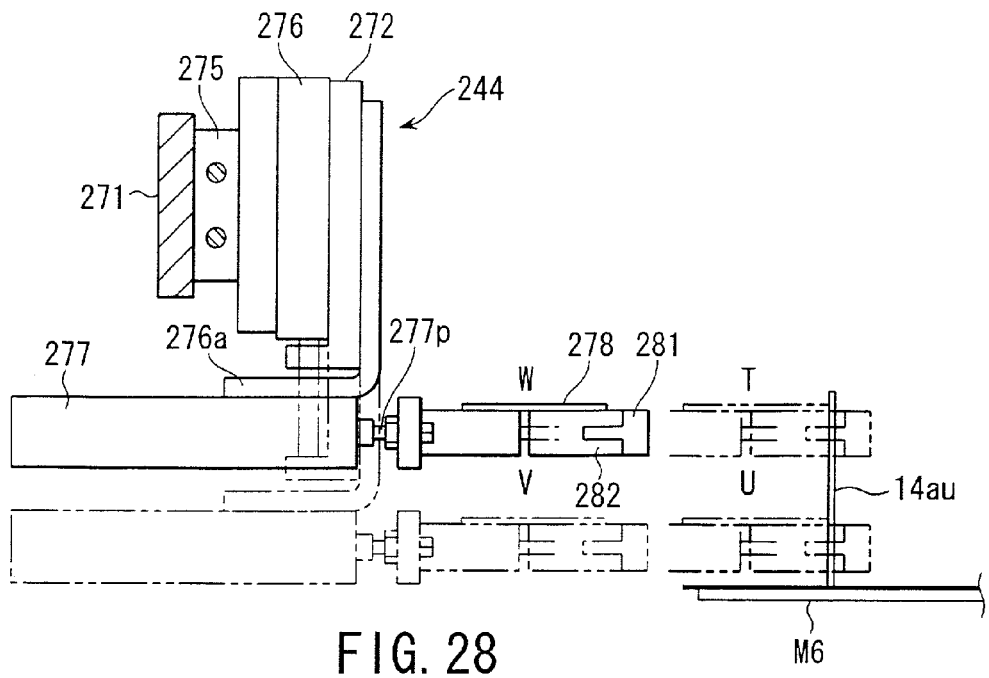
FIG. 28 is a sectional view taken along line F28—F28 of FIG. 27.
Figure 29:
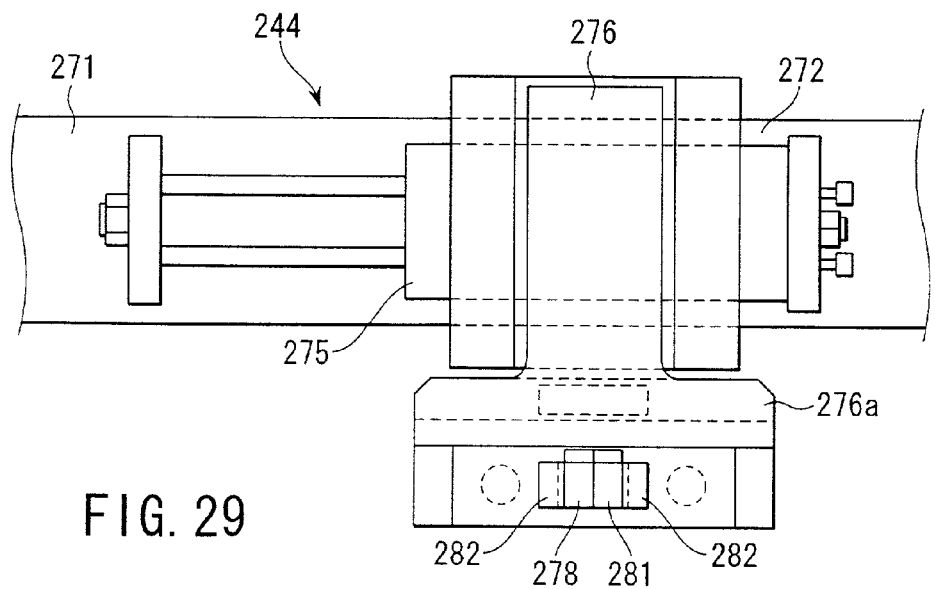
FIG. 29 is a view of the wire support section seen from a direction of an arrow F29 of FIG. 27.

As shown in FIGS. 27 to 29, the wire support mechanism 272 includes a moving device 275, elevating device 276, moving device 277, and support chuck 278. The moving device 275, elevating device 276, and moving device 277 have air cylinders.

The moving device 275 is attached to the bracket 271. The moving device 275 reciprocates/moves the elevating device 276 connected to the moving device in the width direction of the fifth conveyor 240. The elevating device 276 includes a vertically movable portion 276a. The moving device 277 is connected to a lower end of the movable portion 276a. The elevating device 276 raises/lowers the moving device 277 together with the movable portion 276a. The support chuck 278 is connected to a tip end of a piston rod 277p of the moving device 277. The support chuck 278 can three-dimensionally move by the moving device 275, elevating device 276, and moving device 277.

The support chuck 278 is a so-called air chuck. The chuck 278 is formed by a guide block 281, a pair of fingers 282, a torsional spring (not shown), and air type closing means (not shown). The fingers 282 are attached to opposite sides of the guide block 281 so that the fingers can open/close. The torsional spring constantly biases the pair of fingers 282 in an open direction. The closing means closes the pair of fingers 282 against the torsional spring with an air force.

A width of the guide block 281 is slightly smaller than a distance between the upward portions 13au, 14au of the output lead wires 13a, 14a. A tip end of the guide block 281 is formed in a tapered shape so that the tip end can smoothly be inserted and disposed between the upward portions 13au, 14au (see FIG. 27). The pair of fingers 282 are disposed to close and individually hold the upward portions 13au, 14au with side surfaces of the guide block 281.

The wire support section 244 is disposed so that the support chuck 278 is correctly opposite to the upward portions 13au, 14au projected on the substrate M6 positioned in the fifth conveyor 240 (see FIG. 26). The arrangement is formed prior to the sheet covering operation by the sheet set section 243. In this case, the support chuck 278 is in a raised position (reference position W) as shown by a solid line of FIG. 28.

The support chuck 278 is lowered to a lowered backward position shown by V in FIG. 28 from the reference position W by the elevating device 276, and subsequently moved to a lowered forward position shown by U in FIG. 28 by the moving device 277. Thereby, the guide block 281 is inserted between the pair of upward portions 13au, 14au. In this state the pair of fingers 282 are closed by the closing means (not shown), and lower portions of the upward portions 13au, 14au are held and pinched by the support chuck 278 and fingers 282. In the pinched state, the support chuck 278 is raised to a raised forward position shown by T in FIG. 28 by the elevating device 276. Accordingly, the upward portions 13*au*, 14*au* of the output lead wires 13*a*, 14*a* are ironed out and extended straight.

After the pair of fingers 282 are opened in the raised position, the support chuck 278 is moved backwards to the reference position W by the moving device 277. Subsequently, the support chuck 278 is moved to the lowered forward position U via the lowered backward position V by the elevating device 276 and moving device 277. The lower portions of the upward portions 13*au*, 14*au* are pinched in the lowered forward position U. Thereby, rising states of the ironed out and straightened upward portions 13*au*, 14*au* can be stabilized by the support chuck 278.

In this state the sheet covering operation by the sheet set section 243 is performed as described above. Therefore, the upward portions 13*au*, 14*au* can securely be passed through the holes 257 of the third sealing sheet 23.

After the wires are passed, the support chuck 278 releases the pinched upward portions 13*au*, 14*au*, and is moved to the lowered backward position V and then returned to the reference position W. Subsequently, the support chuck 278 is moved to the raised forward position T, and pinches upper portions of the upward portions 13*au*, 14*au* passed through the holes 257 in this position. In this state, the vacuum suction of the transfer head 261 is canceled, and the third sealing sheet 23 is set. Therefore, there is no fear that the upward portions 13*au*, 14*au* passed through the holes 257 are inadvertently bent or cause trouble in the next process. In the sheet setting including the wire passing, the support chuck 278 pinching the upward portions 13*au*, 14*au* and the transfer head 261 are prevented from interfering with each other by the concave portion (not shown) of the head 261.

A substrate M7 with the third sealing sheet 23 laminated on the second sealing sheet 22 as described above is shown in FIG. 7. The substrate M7 is transported to a sixth conveyor 290 with the transport operation of the fifth conveyor 240 and sixth conveyor 290 continuously disposed in the transport direction.

The sixth work stage S6 of the transport way 32 is formed by the sixth conveyor 290 (see FIG. 10). Since a constitution of the conveyor 290 is similar to that of the first conveyor 40 excluding the following respects, the same constitution as that of the first conveyor 40 is denoted with the same reference numerals, and description thereof is omitted. In the sixth conveyor 290, the lead wire receiving portions 46 are not disposed, but a positioning mechanism (not shown) for automatically positioning the substrate M7 in a predetermined position T is disposed. The positioning mechanism includes a stopper, pusher, and the driving device of the stopper and pusher. The stopper is projected from below into the transport way of the substrate M7 transported by the sixth conveyor 290. The pusher pushes the substrate M7 positioned by the stopper from one side of the width direction.

Figure 30:
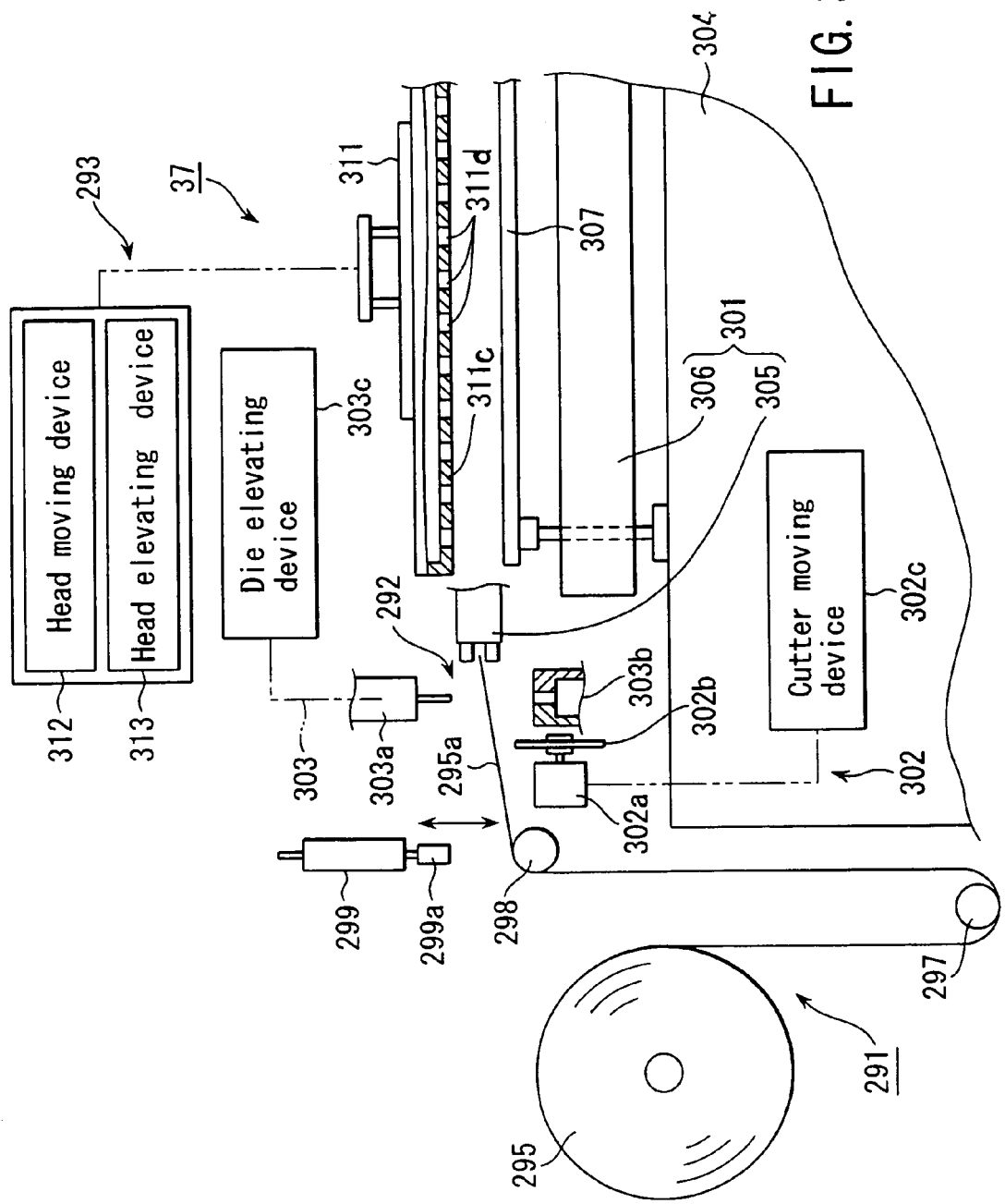
FIG. 30 is a side view schematically showing a fourth sheet set apparatus disposed in the sealing preparation apparatus of FIG. 10.

As shown in FIG. 10, the fourth sheet set apparatus 37 is disposed for the fifth work stage S6 along one side of the width direction of the transport way 32, and disposed at the downstream position with respect to the third sheet set apparatus 36 in the transport direction of the substrate M7. As shown in FIG. 30, the fourth sheet set apparatus 37 includes a sheet supply section 291, sheet cutting section 292, sheet set section 293, and wire support section (not shown). The sheet set apparatus 37 cuts a fourth sealing sheet 24 which has a shape larger than that of the substrate M7 from a fourth sheet 295, and covers the whole substrate M7 positioned in the sixth work stage S6 with the fourth sealing sheet 24 from above.

The sheet supply section 291 has a constitution similar to that of the sheet supply section 51 of the first sheet set apparatus 33. The sheet supply section 291 includes a dancer roller 297, guide roller 298, and press cylinder 299 of the air type. The dancer roller 297 guides a fed portion 295*a* of the fourth sheet 295 wound in the roll shape, while applying a tension on the fed portion 295*a*. The guide roller 298 is disposed above the dancer roller 297.

A width of the fourth sheet 295 is larger than that of the substrate M7 and first sealing sheet 21. The fed portion 295*a* of the sheet 295 is guided into the sheet cutting section 292 via the dancer roller 297 and guide roller 298. When the fed portion 295*a* is pulled in the feeding direction, the fourth sheet 295 freely rotates with the rotation shaft (not shown) passed through the central portion of the sheet and the feeding is continued. The press cylinder 299 is disposed right above the guide roller 298. The cylinder 299 lowers a head 299*a*, and sandwiches the fed portion 295*a* with the guide roller 298.

The sheet cutting section 292 includes a sheet drawing mechanism 301, first cutting mechanism 302, and second cutting mechanism 303. The sheet drawing mechanism 301 includes a chuck moving device 306, and sheet chuck 305. The chuck moving device 306 is fixed onto an apparatus base 304 disposed along the sixth conveyor 290. The sheet chuck 305 moved by the chuck moving device 306 has an openable/closable tip end for pinching a tip end of the fed portion 295*a*.

The chuck moving device 306 reciprocates/moves the sheet chuck 305 over a pinching position (see a position of the sheet chuck 305 shown by a solid line in FIG. 30) and a first drawing position. The chuck moving device 306 pinches the fed portion 295*a* in the pinching position. In the first drawing position, the fed portion 295*a* is cut/treated by the first cutting mechanism 292 and the fourth sealing sheet 24 is obtained. The chuck moving device 306 reciprocates/moves the sheet chuck 305 to the second drawing position from the first drawing position. In the second drawing position, the fourth sealing sheet 24 is cut/treated by the second cutting mechanism 303. The sheet chuck 305 is reciprocated/moved to the second drawing position from the first drawing position. The chuck moving device 306 moves the sheet chuck 305 to the third drawing position from the second drawing position. In the third drawing position, the fourth sealing sheet 24 is transferred onto the predetermined position on a support table 307 arranged on the apparatus base 304. The sheet chuck 305 can move to the pinching position from the third drawing position.

The first cutting mechanism 302 and second cutting mechanism 303 are positioned between the guide roller 298 and the pinching position, and mounted on the apparatus base 304. The first cutting mechanism 302 includes a rotation blade 302*b* driven by a motor 302*a*, and a cutter moving device 302*c*. The cutter moving device 302*c* reciprocates/moves the motor 302*a* and rotation blade 302*b* along the width direction of the fed portion 295*a*. With the movement, the fed portion 295*a* drawn to the first drawing position is cut, and the fourth sealing sheet 24 is formed.

The second cutting mechanism 303 includes a pair of upper and lower blanking dies 303*a*, 303*b*, and a die elevating device 303*c*. The blanking dies 303*a*, 303*b* are disposed on the downstream side of the transport direction of the substrate M7 with respect to the first cutting mechanism 302. The die elevating device 303*c* raises/lowers the upper blanking die 303a with respect to the lower blanking die 303b. The cutting mechanism 303 forms a hole 308 (see FIG. 10) as a second wire passing portion in a substantially central portion of the fourth sealing sheet 23 with the cutting operation by blanking. The hole is made while the fourth sealing sheet 24 is drawn to the second drawing position. The hole 308 is larger than the hole 257 as the first wire passing portion. The first and second wire passing portions can also be formed as cutouts.

The sheet cutting section 302 first draws the fed portion 295a of the fourth sheet 295 to the first drawing position, and the first cutting mechanism 302 is operated in this state. Subsequently, the sheet cutting section 302 draws/moves the cut and obtained sheet to the second drawing position, the second cutting mechanism 303 is operated in this state, and the hole is made in the sheet. This operation is repeated. The sheet cutting section 302 successively obtains the fourth sealing sheet 24 having a predetermined shape to be set on the substrate M7.

As shown in FIG. 30, the sheet set section 293 includes a fourth vacuum suction type transfer head 311, head moving device 312, and head elevating device 313. The transfer head 311 includes a wall 311c which has the same size or a larger size as compared with the size of the fourth sealing sheet 24. The wall 311c forms a lower surface of the transfer head 311, and has a flat surface. In the wall 311c, a large number of suction holes 311d are disposed in the whole area, that is, in substantially the same range as the size of the fourth sealing sheet 24. The transfer head 311 has a concave portion 311a formed through a thickness direction as shown in 31A. The concave portion 311a is disposed to avoid interference among the transfer head 311, support chuck 278, and upward portions 13au, 14au during the operation for passing the upward portions 13au, 14au through the hole 308. The transfer head 311 is connected to a vacuum suction source (not shown) via a flexible tube which does not inhibit the head 311 from moving.

The head moving device 312 and head elevating device 313 have configurations similar to those of the head moving device 72 and head elevating device 73 of the first sheet set apparatus 33, therefore the constitution is denoted with the same reference numerals, and description thereof is omitted to avoid redundant description. The transfer head 311 connected to the head elevating device 313 is reciprocated/moved over the sheet receiving position and sheet covering position by the head moving device 313, and raised/lowered by the head elevating device 313 in both the positions. The transfer head 311 is disposed right above the support table 307 in the sheet receiving position. The transfer head 311 is disposed right above the substrate M7 positioned by the sixth conveyor 290 in the sheet covering position.

The transfer head 311 raised in the sheet receiving position is disposed above the transport way of the sheet chuck 305. The transfer head 311 lowered in the sheet receiving position holds the whole cut fourth sealing sheet 24 with the support table 307. The transfer head 311 is evacuated, while holding the fourth sealing sheet 24. The fourth sealing sheet 24 can therefore be attracted to the transfer head 311.

The transfer head 311 raised in the sheet covering position is correctly positioned right above and opposite to the substrate M7. The transfer head 311 lowered in the sheet covering position holds the whole fourth sealing sheet 24 with the substrate M7. After the transfer head 311 stops attracting the sheet, while the sheet 24 remains held between the head 311 and the substrate M7, it is raised, the fourth sealing sheet 24 is reliably be transferred onto the substrate M7, cover the substrate M7.

In the sheet setting, the wire support section (not shown) is used to pass the upward portions 13au, 14au of the output lead wires 13a, 14a through the hole 308 of the fourth sealing sheet 24. Since the constitution and operation of the wire support section (not shown) are the same as those of the wire support section 244 of the third sheet set apparatus 36, description thereof is omitted to avoid redundant description.

In the fourth sheet set apparatus 37, the fourth sheet 295 can be automatically fed and cut from the fed portion 295a, thus providing a piece having the predetermined shape. The piece of sheet can be automatically transported to the substrate M7 and covers the substrate M7. This sequence of automatic operations is similar to that performed in the first to third sheet apparatuses 34, 35 and 36. In this case, since the whole fourth sealing sheet 24 is adsorbed and the substrate M7 is covered with the sheet, the wrinkle smoothing operation of the covered fourth sealing sheet 24 is not required. During the sheet setting by the fourth sheet set apparatus 37, the rising states of the ironed out and straightened upward portions 13au, 14au of the output lead wires 13a, 14a are steadily held by the support chuck of the wire support section (not shown). Therefore, similarly as in the third sheet set apparatus 36, the upward portions 13au, 14au can securely be passed through the hole 308 of the fourth sealing sheet 24.

Figure 31A:
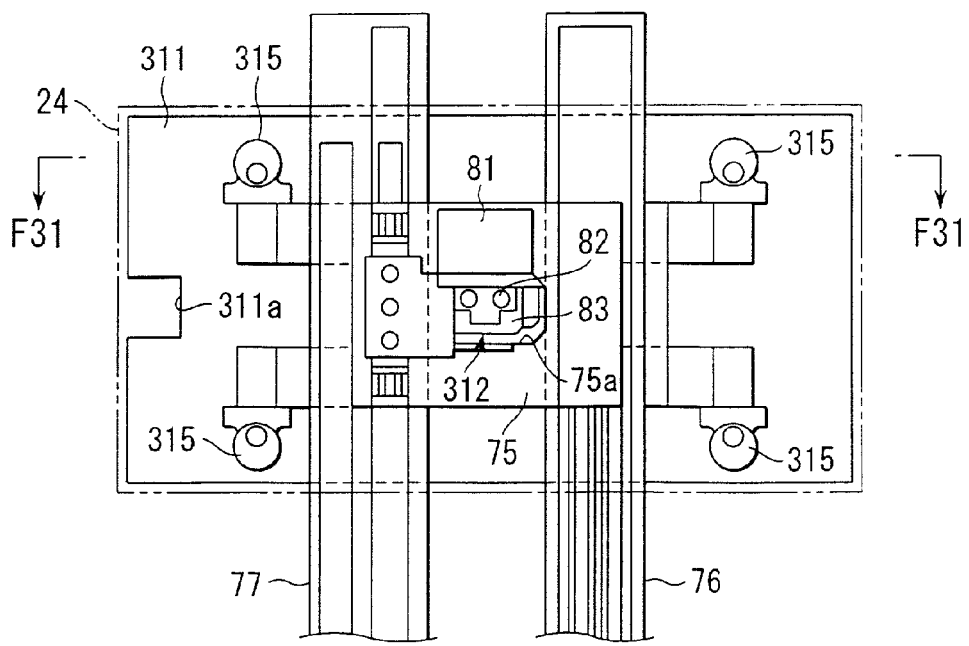
FIG. 31A is a plan view showing a portion around the transfer head disposed in the fourth sheet set apparatus of FIG. 30.
Figure 31B:
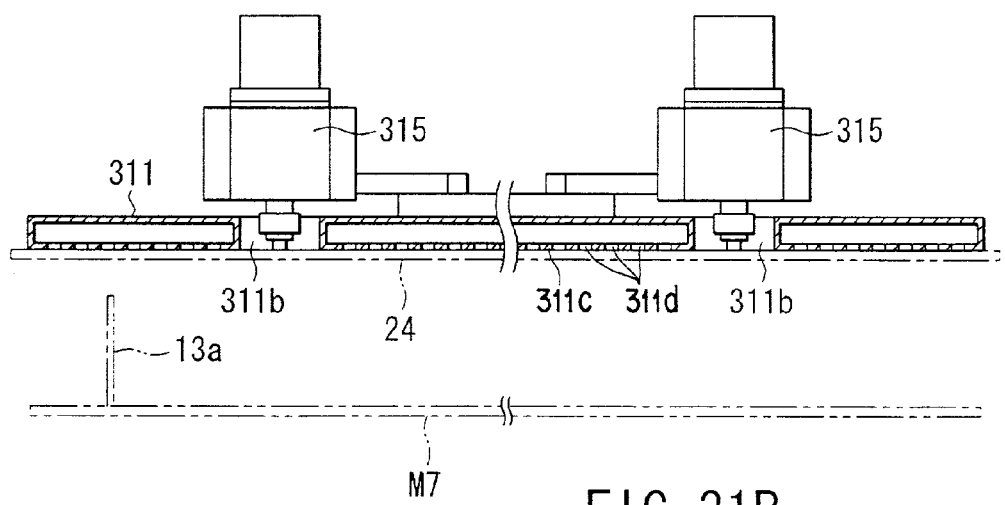
FIG. 31B is a schematically sectional view of the transfer head taken along line F31—F31 of FIG. 31A.

As shown in FIGS. 31A to 31C, four heater units 315 having the same constitutions as those of the heater units 230, 231 are mounted on the transfer head 311. The tip ends of these units 315 are inserted into the holes 311b formed in the transfer head 311. The transfer head 311 covers the substrate M7 with the fourth sealing sheet 24, and the heater units 315 are energized, before the vacuum suction of the head 311 is canceled. Therefore, tip ends of the respective heater units 315 which press the fourth sealing sheet 24 locally heat/melt the first and fourth sheets 21, 24 of EVA disposed right under the tip ends, and the sheets 21, 24 can be bonded to each other. Two of tentatively bonded portions are shown by E in FIG. 8. Thereby, the fourth sealing sheet 24 or the like can be prevented from being inadvertently during the transport to a laminator described later, and the quality of the photovoltaic module can be inhibited from being degraded.

A substrate M8 with the fourth sealing sheet 24 laminated thereon as described above is shown in FIG. 8. The substrate M8 is transported to a seventh conveyor 320 with the transport operation of the sixth conveyor 290 and seventh conveyor 320 continuously disposed to be adjacent in the transport direction.

Figure 32:
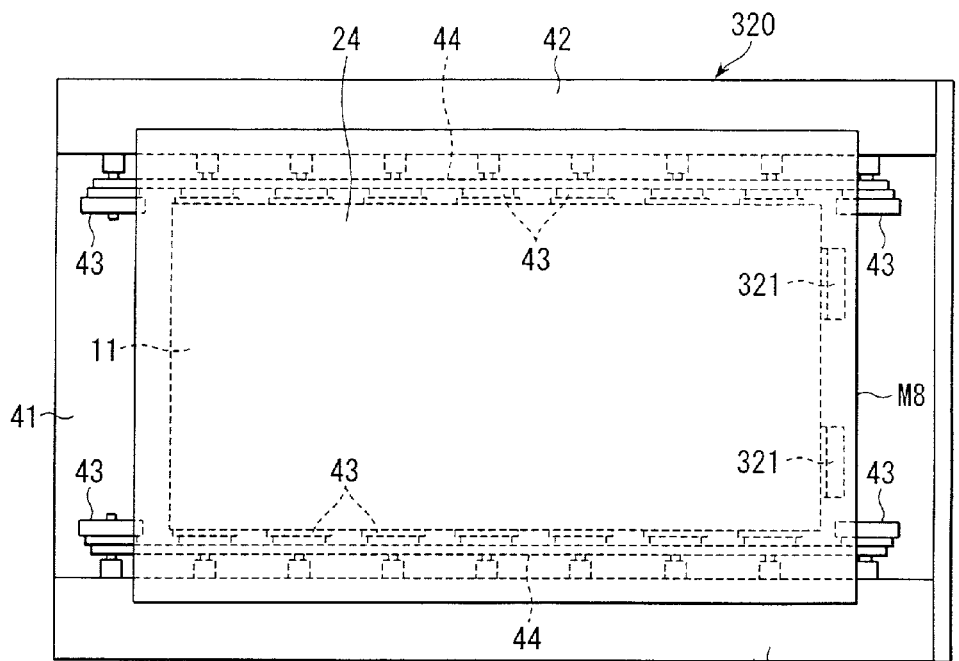
FIG. 32 is a plan view showing a discharge section of the transport way disposed in the sealing preparation apparatus of FIG. 10.

The seventh work stage S7 of the transport way 32 is formed by the seventh conveyor 320 shown in FIG. 32. Since a constitution of the conveyor 320 is similar to that of the first conveyor 40 excluding the following respects, the same constitution as that of the first conveyor 40 is denoted with the same reference numerals, and description thereof is omitted. In the seventh conveyor 320, the lead wire receiving portions 46 are not disposed, but fixing stoppers 321 for automatically positioning the substrate M8 in the predetermined position are disposed. The fixing stoppers 321 are constantly projected from below into the transport way of the seventh conveyor 320.

Figure 9:
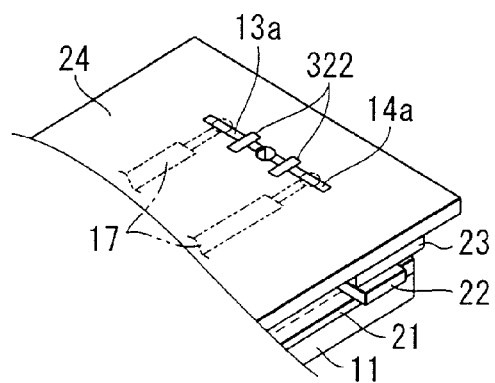
FIG. 9 is a perspective view showing that a pair of output lead wires of the laminate of FIG. 8 are taped/fixed and sealing preparation is completed.

The substrate M8 transported and positioned in the seventh work stage S7 is manually subjected to a final treatment. In the treatment, the upward portions 13au, 14au drawn to the outside through the sealing layer 15 are bent in a reverse direction from each other using an edge of the hole 308 as the reference. Subsequently, the upward portions 13*au*, 14*au* are held by an adhesive tape 322 along the fourth sealing sheet 24. A state in which the final treatment is performed in this manner is shown in FIG. 9.

A post-process of the substrate whose sealing preparation is completed as described above will briefly be described. First, the substrate having the sealing preparation completed is removed from the seventh conveyor 320 and transferred to the laminator (not shown) by a manual operation or an automatic machine. The substrate 11 facing downwards is set in the laminator. Subsequently, the laminator performs a heating pressure bonding treatment in which the first and third sheets 21, 23 are molten and crosslinked. Thereafter, while the upward portions 13*au*, 14*au* of the output lead wires 13*a*, 14*a* are connected to the terminal box 16, the terminal box 16 is attached to the back surface of the fourth sealing sheet 24 using an adhesive. The photovoltaic module M is thereby prepared. If necessary, portions of the fourth sealing sheet 24 sticking out of the substrate 11 are cut, or a frame is attached to a peripheral portion of the module M for use.

The sealing preparation apparatus 31 performs the sealing preparation of the photovoltaic module M in which the one-end portions of the pair of positive and negative lead wires 13, 14 are used as the output lead wires 13*a*, 14*a* as described above. In the sealing preparation, the first to fourth sealing sheets 21 to 24 are automatically set with respect to the substrate 11. That is, the feeding operation of the first to fourth sheets 54, 95, 245, 295, the cutting operation for cutting the first to fourth sealing sheets 21 to 24 having the predetermined shapes from these fed portions of the sheets, the operation for transporting the respective cut sealing sheets 21 to 24 and covering the substrate 11 with the sheets, and the like are automatically performed. In this case, the wrinkle smoothing operation is not required with respect to the respective sealing sheets 21 to 24 with which the substrate 11 is covered.

In the sealing preparation apparatus 31, the output lead wire set apparatus 35 can automate a plurality of bending operations with respect to the output lead wires 13*a*, 14*a* integral with the lead wires 13, 14.

In the third and fourth sheet set apparatuses 36, 37, the rising states of the upward portions 13*au*, 14*au* of the output lead wires 13*a*, 14*a* are held by the wire support section 244 described with reference to the third sheet set apparatus 36. Therefore, in the operation in which the cut third and fourth sealing sheets 23 and 24 having the hole 257 the hole 308, respectively, are transported onto the substrate 11 to cover it, the upward portions 13*au*, 14*au* are securely passed through the holes 257, 308, and the sheet covering operation can be performed.

According to the sealing preparation apparatus 31 of the present embodiment, most of the sealing preparation operations can be automated with respect to the photovoltaic module M in which the one-end portions of the pair of positive and negative lead wires 13, 14 are used as the output lead wires 13*a*, 14*a*. Therefore, the productivity and quality of the photovoltaic module M can be enhanced.

Figure 33:
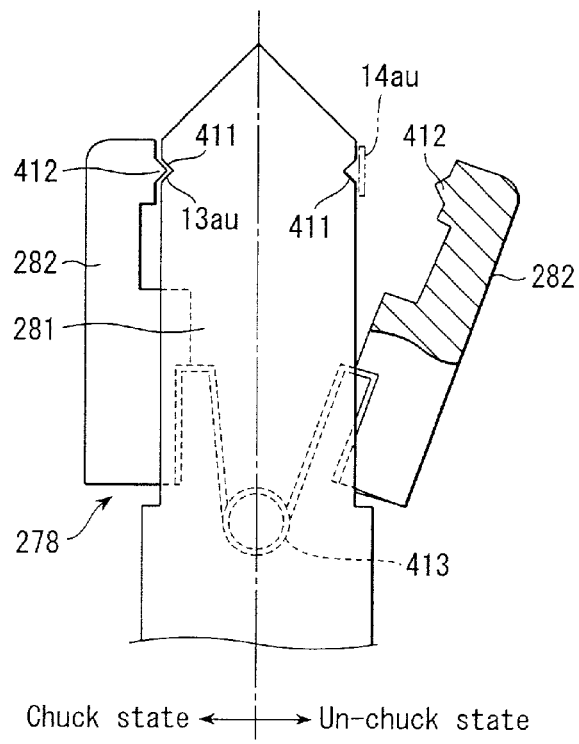
FIG. 33 is a partially sectional plan view of a drawing chuck of the wire support section disposed in the sealing preparation apparatus according to a second embodiment of the present invention.

A second embodiment of the present invention will be described with reference to FIG. 33. The second embodiment is basically the same as the first embodiment. Therefore, the same constitution as that of the first embodiment is denoted with the same reference numerals of the corresponding parts of the first embodiment, description thereof is omitted, and a constitution different from that of the first embodiment will be described hereinafter. The second embodiment is different from the first embodiment in a constitution of the support chuck.

Concave grooves 411 are arranged in opposite side surfaces of the guide block 281 of the support chuck 278. The concave grooves 411 open in opposite surfaces of the guide block 281 in the thickness direction. In side surfaces of the finger 282, convex portions 412 are disposed opposite to the concave grooves 411. The convex portions 412 extend along a total length of the finger 282 in the thickness direction. When the fingers 282 close, the convex portions 412 are fitted in the concave grooves 411. When the upward portions 13*au*, 14*au* of the output lead wires 13*a*, 14*a* are pinched by the support chuck 278, the upward portions 13*au*, 14*au* are individually held between the corresponding concave grooves 411 and the convex portions 412. A right-side part of a center line of FIG. 33 shows an un-chuck (non-pinching) state, and a left-side part shows a chuck (pinching) state.

When the support chuck 278 constituted in this manner is used to pinch the upward portions 13*au*, 14*au*, the upward portions 13*au*, 14*au* can be transformed in accordance with shapes of the concave grooves 411 and convex portions 412. In FIG. 33, the upward portions 13*au*, 14*au* are transformed, for example, into substantially V-shaped sections. As described above, since the support chuck 278 irons the upward portions 13*au*, 14*au* in an upward direction, these upward portions 13*au*, 14*au* are not only straightened/extended but also strengthened so as not to be easily deformed. Therefore, the upward portions 13*au*, 14*au* can more easily and securely be inserted into the holes (wire passing portions) of the third and fourth sheets. Reference numeral 413 in FIG. 33 shows a torsional spring for biasing the finger 282. The second embodiment excluding the aforementioned respects and including the constitution not shown in FIG. 33 is the same as the first embodiment.

In the second embodiment, the convex portions 412 may be disposed in the side surfaces of the guide block 281, and the concave grooves 411 may be disposed in the side surfaces of the fingers 282. The shapes of the concave groove 411 and convex portion 412 are not limited to the substantial V shape, and but may be formed in a substantial W or U shape.

A third embodiment of the present invention will be described with reference to FIGS. 34 to 36. The third embodiment is basically the same as the first embodiment. Therefore, the same constitution as that of the first embodiment is denoted with the same reference numerals of the corresponding parts of the first embodiment, description thereof is omitted, and a constitution different from that of the first embodiment will be described hereinafter. The third embodiment is different from the first embodiment in a constitution of the wire support section.

The wire support section 244 includes a pair of upper and lower moving devices 277*a*, 277*b* constituted of air cylinders connected to the elevating device 276. An upper support chuck 278*a* is connected to the tip end of the piston rod 277*p* of the upper moving device 277*a*. A lower support chuck 278*b* is connected to the tip end of the piston rod 277*p* of the lower moving device 277*b*. These support chucks 278*a*, 278*b* have the same constitution as that of the support chuck 278 of the first or second embodiment. The upper support chuck 278*a* is used to pinch the upper portions of the upward portions 13*au*, 14*au* of the output lead wires 13*a*, 14*a*. The lower support chuck 278*b* is used to grasp the lower portions of the upward portions 13*au*, 14*au*.

Figure 34:
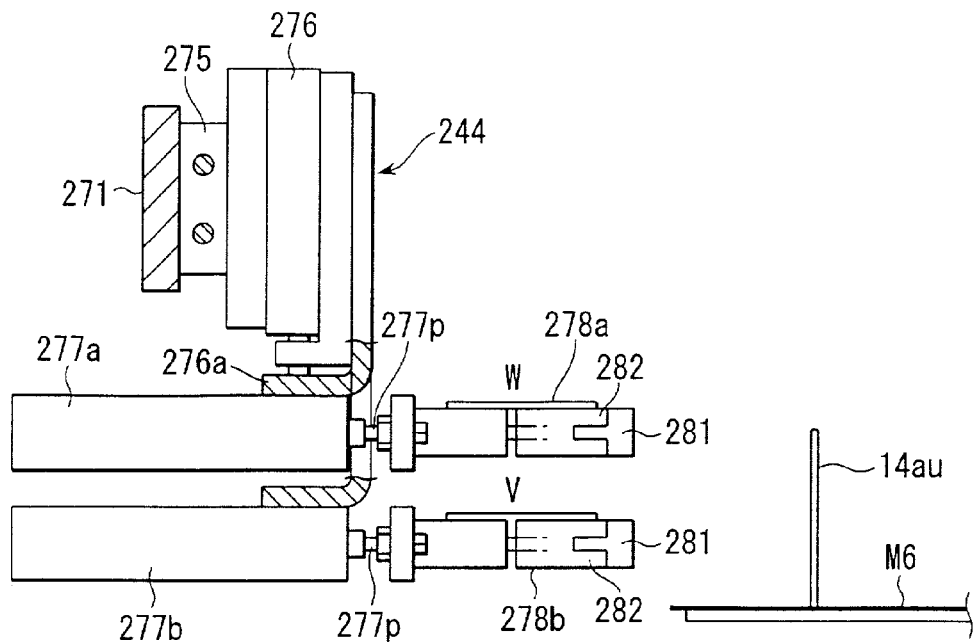
FIG. 34 is a side view of the wire support section in a standby state disposed in the sealing preparation apparatus according to a third embodiment of the present invention.
Figure 35:
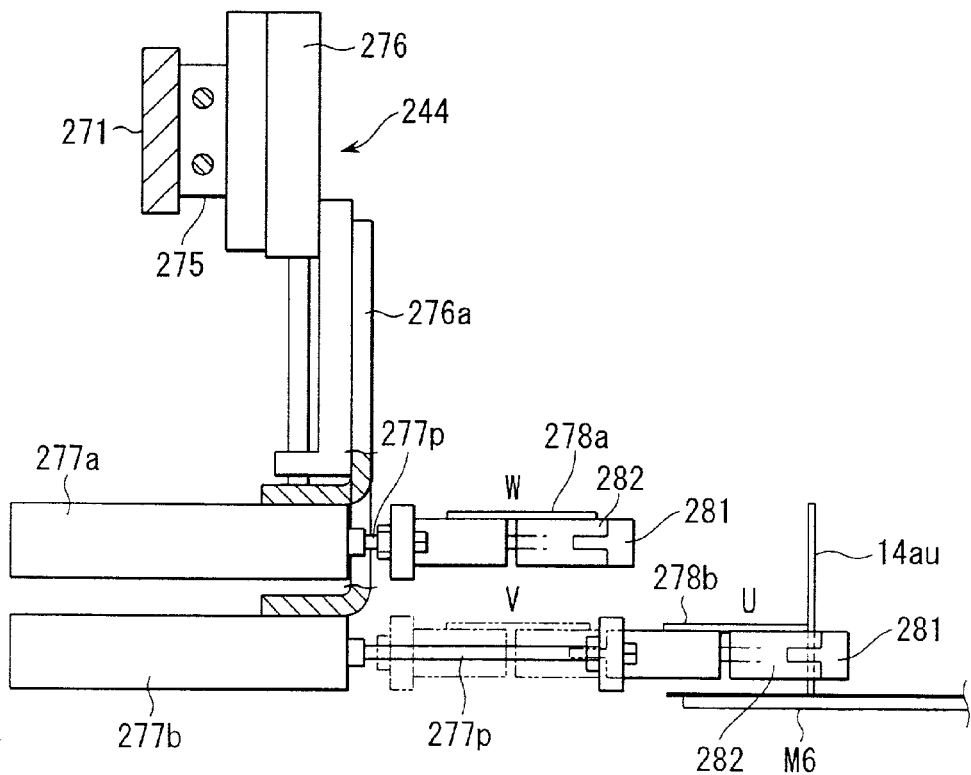
FIG. 35 is a side view showing an operation of the wire support section of FIG. 34.

The pair of upper and lower moving devices 277*a*, 277*b* of the wire support section 244 are lowered to the use position shown by FIG. 35 from the standby position shown in FIG. 34 by the elevating device 276 and used. A use mode will be described. First, as shown in FIG. 35, by the operation of the lower moving device 277b the lower support chuck 278b is moved forwards to the upward portions 13au, 14au. The moved lower support chuck 278b pinch the root portions of the upward portions 13au, 14au, and is raised together with the upper moving device 277a by the elevating device 276. Thereby, the upward portions 13au, 14au are ironed out. Thereafter, the lower support chuck 278b releases the grasped upward portions 13au, 14au and returns to the standby position.

Subsequently, the pair of upper and lower moving devices 277a, 277b are again lowered to the use position. Thereafter, as shown in FIG. 35, in accordance with the movement of the operated lower moving device 277b the lower support chuck 278b moves to the upward portions 13au, 14au, and pinches the lower portions of the upward portions 13au, 14au. Thereby, the rising state of the upward portions 13au, 14au is stabilized. In this state the sheet covering operation of the third or fourth sealing sheet is performed, and the upward portions 13au, 14au are passed through the holes (wire passing portions) of the sheet.

Figure 36:
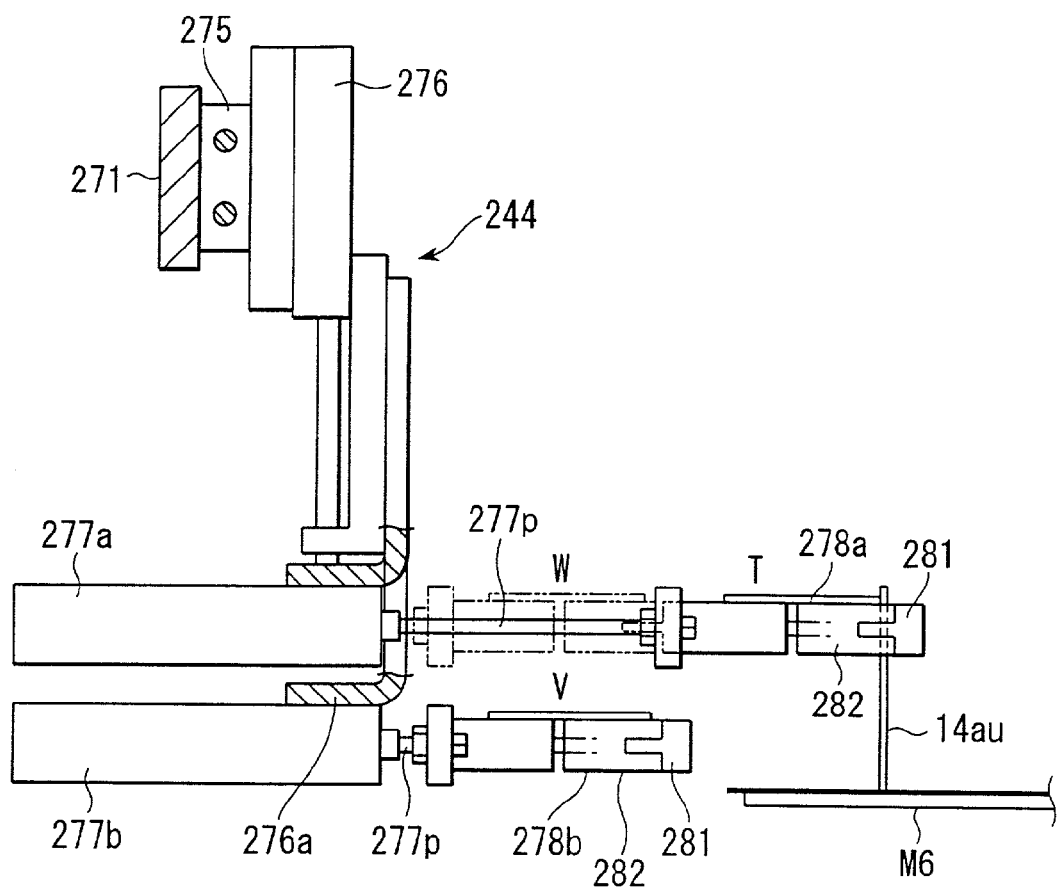
FIG. 36 is a side view showing the operation of the wire support section of FIG. 34.

Thereafter, as shown in FIG. 36, by the operation of the upper moving device 277a, the upper support chuck 278a is moved forwards to the upward portions 13au, 14au. The moved upward support chuck 278a pinches the upper portions of the upward portions 13au, 14au, and stabilizes the rising state of the upward portions 13au, 14au. In this state, the lower support chuck 278b releases the pinched upward portions 13au, 14au, and the lower support chuck 278b is retreated by the operation of the lower moving device 277b. In this state, the vacuum suction of the transfer head is released, and the third or fourth sealing sheet is transferred onto the substrate 11.

In the third embodiment, as described above, the upper and lower support chucks 278a, 278b pinch/transfer the upward portions 13au, 14au. Therefore, during wire passing, the upward portions 13au, 14au are not deformed by the sealing sheet, and the upward portions 13au, 14au can securely be passed through the holes as the wire passing portions of the sheet. Additionally, as compared with the operation of the single support chuck 278 described in the first or second embodiment, alternate operation of the upper and lower support chucks 278a, 278b is quick, and operation efficiency can be enhanced.

In the respective embodiments of the present invention, the cutting of the sheet is not restricted by use of the rotation blade as the cutter, and can be performed by press-cutting using a Thomson blade or a press die, or by laser, or the like. The sheet cutting section performs at least one cutting, and when a plurality of cuttings are performed, a cutting method can be employed in accordance with the respective cutting sections. In the respective embodiments of the present invention, the output lead wire is bent using the first guide plate used as the reference, but may be bent to overlap the lead wire.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An output lead wire set apparatus for sealing preparation, which performs sealing preparation of a photovoltaic portion disposed on one surface of a substrate, and a pair of lead wires connected to the portion and having one-end portions forming output lead wires, said apparatus comprising:

a pair of first bend guide sections which are disposed on opposite sides of a width direction of a transport way for transporting said substrate with said one surface facing upwards, while said output lead wires remain disposed at an upstream position with respect to a transport direction, which include a first guide plate as a reference for bending said output lead wires, and which reciprocate/move the guide plate over a use position intersecting said lead wires on said transport way and a retreat position out of said transport way;

a pair of second bend guide sections which include a second guide plate able to three-dimensionally move, and which reciprocate/move said second guide plate over first press position of one side portion of said second guide plate intersecting a root portion of said output lead wire bent using said first guide plate as the reference, and a second press position of the other side portion of said second guide plate intersecting a middle portion of said output lead wire bent on a side of a central portion of a width direction of said substrate using the one side portion of said second guide plate as the reference; and a wire drawing robot which includes a drawing chuck to pinch said output lead wire and able to three-dimensionally move, and which draws around the chuck, bends said output lead wire using said first guide plate as the reference, bends said output lead wire using the one side portion of said second guide plate as the reference, and bends said output lead wire using the other side portion of said second guide plate as the reference.

2. The output lead wire set apparatus for the sealing preparation according to claim 1, wherein a press mechanism is disposed on said transport way, and the mechanism includes an elevatable press member which presses and folds a first bent portion of said output lead wire formed using said first guide plate as the reference, and a second bent portion of said output lead wire formed using the one side portion of said second guide plate as the reference toward said substrate.

3. A sheet set apparatus for sealing preparation, which performs sealing preparation of a photovoltaic portion disposed on one surface of a substrate, and a pair of lead wires connected to the portion and having one end portions forming output lead wires, said apparatus comprising:

a sheet supply section which is disposed along a transport way for transporting said substrate with said one surface facing upwards, while said output lead wires disposed at an upstream position with respect to a transport remains direction, and which feeds a sheet from a roll;

a sheet cutting section including a cutting mechanism which cuts a sealing sheet having a wire passing portion with said output lead wire passed therethrough and to be set on said substrate from a fed portion of said sheet;

a sheet set section which comprises a transfer head of a vacuum suction type having a plurality of suction holes formed on a lower surface thereof, a head moving device to reciprocate/move the head over a sheet receiving position in said sheet cutting section and a sheet covering position in said transport way, and a head elevating device to raise/lower said transfer head in both said positions, and in which the transfer head attracts said sealing sheet from above at said sheet receiving position and stops attracting said sheet when said head reaches said sheet covering position; and a wire support section which includes a support chuck able to pinch a lower portion of an upward bent portion of said output lead wire, and reciprocates/moves the chuck over a pinching position for pinching said upward portion and a retreat position out of said transport way.

4. The sheet set apparatus for the sealing preparation according to claim 3, wherein a size of said transfer head is not smaller than a size of said sealing sheet, a wall of said transfer head has a flat surface, and said suction holes are formed on the wall of the transfer head over a range which is equal to the size of said sealing sheet which has been cut.

5. The sheet set apparatus for the sealing preparation according to claim 3, wherein said wire support section includes a support chuck which can move in a direction attached to/detached from said upward portion and a vertical direction, pinches an upper portion of said upward portion passed through said wire passing portion in a raised position, and pinches a lower portion of said upward portion in a lowered position, and a concave portion escaping from said support chuck is disposed in said transfer head.

6. The sheet set apparatus for the sealing preparation according to claim 3, wherein said wire support section includes an upper support chuck which can move in a direction attached to/detached from said upward portion and can pinch an upper portion of said upward portion passed through said wire passing portion, and a lower support chuck which can move in the direction attached to/detached from said upward portion and can pinch a lower portion of said upward portion, and a concave portion escaping from said support chuck is disposed in said transfer head.

7. A sealing preparation apparatus which performs sealing preparation of a photovoltaic portion disposed on one surface of a substrate, and a pair of lead wires connected to the portion and having one end portions forming output lead wires, said apparatus comprising:

a transport way to transport said substrate with said one surface faces upwards, while said output lead wires are remains disposed at an upstream position with respect to a transport direction;

a first sheet set apparatus which includes a first transfer head of a vacuum suction type, which is disposed along said transport way, which cuts a first sealing sheet from a fed portion of a first sheet wound in a roll shape, and in which the first transport head attracts and transports the sealing sheet, and stops attracting the sealing sheet on said transport way, and the sealing sheet covers said substrate;

a second sheet set apparatus which is disposed on a downstream side from the first sheet set apparatus in the transport direction, and which cuts a second sealing sheet from a fed portion of an electrically insulating second sheet wound in the roll shape, and covers said first sealing sheet with the second sealing sheet on said transport way;

an output lead wire set apparatus which is disposed at the downstream position with respect to the second sheet set apparatus in the transport direction, and which comprises a pair of first bend guide sections including a first guide plate as a reference for bending said output lead wires, a pair of second bend guide sections including a second guide plate having one side portion as a reference for bending said output lead wires bent on a side of a central portion of a width direction of said substrate using said first guide plate as the reference and the other side portion as the reference for bending upwards said output lead wires bent using the one side portion as the reference, and a drawing robot including a drawing chuck to pinch said output lead wire and three-dimensionally move;

a third sheet set apparatus which comprises a third transfer head of the vacuum suction type, which is disposed at the downstream position with respect to said output lead wire set apparatus in the transport direction, and which cuts a third sealing sheet having a first wire passing portion from a fed portion of a third sheet wound in the roll shape, and in which the third transfer head attracts and transports said third sealing sheet and stops attracting said the third sealing sheet on said transport way, and the third sealing sheet covers said second sealing sheet so as to pass said upward portion through said first wire passing portion; and a fourth sheet set apparatus which comprises a fourth transfer head of the vacuum suction type, which is disposed at the downstream position with respect to said third sheet set apparatus in the transport direction, and which cuts a fourth sealing sheet having a second wire passing portion from a fed portion of a fourth sheet wound in the roll shape, and in which the fourth transfer head attracts and transports the fourth sealing sheet and stops attracting said the fourth sealing sheet on said transport way, and the fourth sealing sheet covers said second and third sealing sheets on said substrate with said fourth sealing sheet so as to pass said upward portion through said second wire passing portion.

8. The sealing preparation apparatus according to claim 7, wherein said first sheet set apparatus comprises:

a sheet supply section which is disposed along the transport way for transporting said substrate with said one surface facing upwards, while of said output lead wires remain disposed at the upstream position with respect to the transport direction, and which feeds the sheet from the roll;

a sheet cutting section which cuts said first sealing sheet to be set on said substrate from the fed portion of said sheet; and a sheet set section which comprises said first transfer head of the vacuum suction type with a plurality of suction holes formed in a lower surface thereof, a head moving device to reciprocate/move the head over a sheet receiving position in said sheet cutting section and a sheet covering position in said transport way, and a head elevating device to raise/lower said first transfer head in both said positions, and in which the transfer head attracts said first sealing sheet from above at said sheet receiving position and stops attracting said sheet when said head reaches said sheet covering position.

9. The sealing preparation apparatus according to claim 7, wherein sizes of said first, third, and fourth transfer heads are not smaller than sizes of said first, third, and fourth sealing sheets to be attracted to the transfer heads, walls of said first, third, and fourth transfer heads have flat surfaces, and said attracting holes are formed on the wall of the transfer heads over a range which is equal to the sizes of said first, third, and fourth sealing sheets which have been cut.

10. The sealing preparation apparatus according to claim 7, wherein said output lead wire set apparatus comprises:

a pair of said first bend guide sections which are disposed on opposite sides of a width direction of said transport way, which include said first guide plate as a reference for bending said output lead wires, and which reciprocate/move the guide plate over a use position intersecting said lead wires on said transport way and a retreat position out of said transport way;

a pair of said second bend guide sections which include said second guide plate able to three-dimensionally move, and which reciprocate/move said second guide plate over a first press position of one side portion of said second guide plate intersecting a root portion of said output lead wire bent using said first guide plate as the reference, and a second press position of the other side portion of said second guide plate intersecting a middle portion of said output lead wire bent on a side of a central portion of the width direction of said substrate using the one side portion of said second guide plate; and said wire drawing robot which includes said drawing chuck to pinch said output lead wire and to be able to three-dimensionally move, and which draws around the chuck, bends said output lead wire using said first guide plate as the reference, bends said output lead wire using the one side portion of said second guide plate as the reference, and bends said output lead wire using the other side portion of said second guide plate as the reference.

11. The sealing preparation apparatus according to claim 7, wherein a press mechanism is disposed on said transport way, and the mechanism includes an elevatable press member which presses a first bent portion of said output lead wire formed using said first guide plate as the reference, and a second bent portion of said output lead wire formed using the one side portion of said second guide plate as the reference toward said substrate.

12. The sealing preparation apparatus according to claim 7, wherein said third sheet set apparatus and said fourth sheet set apparatus comprises:

a sheet supply section which is disposed along a transport way for transporting said substrate with said one surface facing upwards, while said output lead wires remain disposed at an upstream position with respect to a transport direction, and which feeds a sheet from a roll;

a sheet cutting section including a cutting mechanism which cuts a sealing sheet having a wire passing portion with said output lead wire passed therethrough and to be set on said substrate from a fed portion of said sheet;

a sheet set section which comprises a transfer head of a vacuum suction type having a plurality of suction holes formed in a lower surface thereof, a head moving device to reciprocate/move the head over a sheet receiving position in said sheet cutting section and a sheet covering position in said transport way, and a head elevating device to raise/lower said transfer head in said both positions, and in which transfer head attracts said sealing sheet from above at said sheet receiving position, and stops attracting said sheet when the head reaches said sheet covering position; and a wire support section which includes a support chuck able to pinch a lower portion of an upward bent portion of said output lead wire, and which reciprocates/moves the chuck over a pinching position for pinching said upward portion and a retreat position out of said transport way.

13. The sealing preparation apparatus according to claim 12, wherein said wire support section includes a support chuck which can move in a direction attached to/detached from said upward portion and a vertical direction, pinches an upper portion of said upward portion passed through said wire passing portion in a raised position, and pinches a lower portion of said upward portion in a lowered position, and a concave portion escaping from said support chuck is disposed in said transfer head.

14. The sealing preparation apparatus according to claim 12, wherein said wire support section includes an upper support chuck which can move in a direction attached to/detached from said upward portion and can pinch an upper portion of said upward portion passed through said wire passing portion, and a lower support chuck which can move in the direction attached to/detached from said upward portion and can pinch a lower portion of said upward portion, and a concave portion escaping from said support chuck is disposed in said transfer head.

* * * * *